(12) United States Patent
Tsai et al.

(10) Patent No.: US 11,955,561 B2
(45) Date of Patent: Apr. 9, 2024

(54) CARRIER MODIFICATION DEVICES FOR AVOIDING CHANNEL LENGTH REDUCTION AND METHODS FOR FABRICATING THE SAME

(71) Applicant: Taiwan Semiconductor Manufacturing Company Limited, Hsinchu (TW)

(72) Inventors: Wu-Wei Tsai, Hsinchu (TW); Hai-Ching Chen, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 189 days.

(21) Appl. No.: 17/382,579

(22) Filed: Jul. 22, 2021

(65) Prior Publication Data
US 2023/0021699 A1    Jan. 26, 2023

(51) Int. Cl.
*H01L 29/786*  (2006.01)
*H01L 27/092*  (2006.01)
*H01L 29/16*  (2006.01)
*H01L 29/221*  (2006.01)
*H01L 29/66*  (2006.01)

(52) U.S. Cl.
CPC ........ *H01L 29/7869* (2013.01); *H01L 27/092* (2013.01); *H01L 29/1604* (2013.01); *H01L 29/221* (2013.01); *H01L 29/6675* (2013.01)

(58) Field of Classification Search
CPC ............. H01L 29/4908; H01L 29/8126; H01L 29/78666; H01L 29/78675; H01L 29/66757; H01L 29/78648; H01L 29/78669; H01L 29/78678; H01L 29/66765; H01L 29/7869; H01L 29/1604; H01L 29/221; H01L 29/6675; H01L 27/092

See application file for complete search history.

(56) References Cited

U.S. PATENT DOCUMENTS

| 3,579,143 A * | 5/1971 | Haydl ...................... H03B 9/12 257/431 |
| 2007/0212825 A1* | 9/2007 | Machida ........... H01L 29/78696 438/151 |
| 2018/0190495 A1* | 7/2018 | Maehara .............. H10K 10/486 |

(Continued)

*Primary Examiner* — Calvin Y Choi
(74) *Attorney, Agent, or Firm* — The Marbury Law Group, PLLC

(57) ABSTRACT

A disclosed transistor structure includes a gate electrode, an active layer, a source electrode, a drain electrode, an insulating layer separating the gate electrode from the active layer, and a carrier modification device that reduces short channel effects by reducing carrier concentration variations in the active layer. The carrier modification device may include a capping layer in contact with the active layer that acts to increase a carrier concentration in the active layer. Alternatively, the carrier modification device may include a first injection layer in contact with the source electrode and the active layer separating the source electrode from the active layer, and a second injection layer in contact with the drain electrode and the active layer separating the drain electrode from the active layer. The first and second injection layers may act to reduce a carrier concentration within the active layer near the source electrode and the drain electrode.

20 Claims, 33 Drawing Sheets

(56) References Cited

U.S. PATENT DOCUMENTS

| | | | |
|---|---|---|---|
| 2019/0288118 A1* | 9/2019 | Song | H01L 29/7869 |
| 2021/0376151 A1* | 12/2021 | Van Dal | H01L 29/78696 |
| 2022/0140197 A1* | 5/2022 | Yen | H01L 33/62 |
| | | | 257/5 |

* cited by examiner

CARRIER MODIFICATION DEVICES FOR AVOIDING CHANNEL LENGTH REDUCTION AND METHODS FOR FABRICATING THE SAME

BACKGROUND

In the semiconductor and integrated circuit (IC) industry there is constant desire to reduce the size of ICs to thereby increase areal and volume density of digital circuits. To do so, individual transistors, interconnects, and related structures have become increasingly smaller and there is an ongoing need to develop new materials, processes, and designs of semiconductor devices and interconnects to allow further progress.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
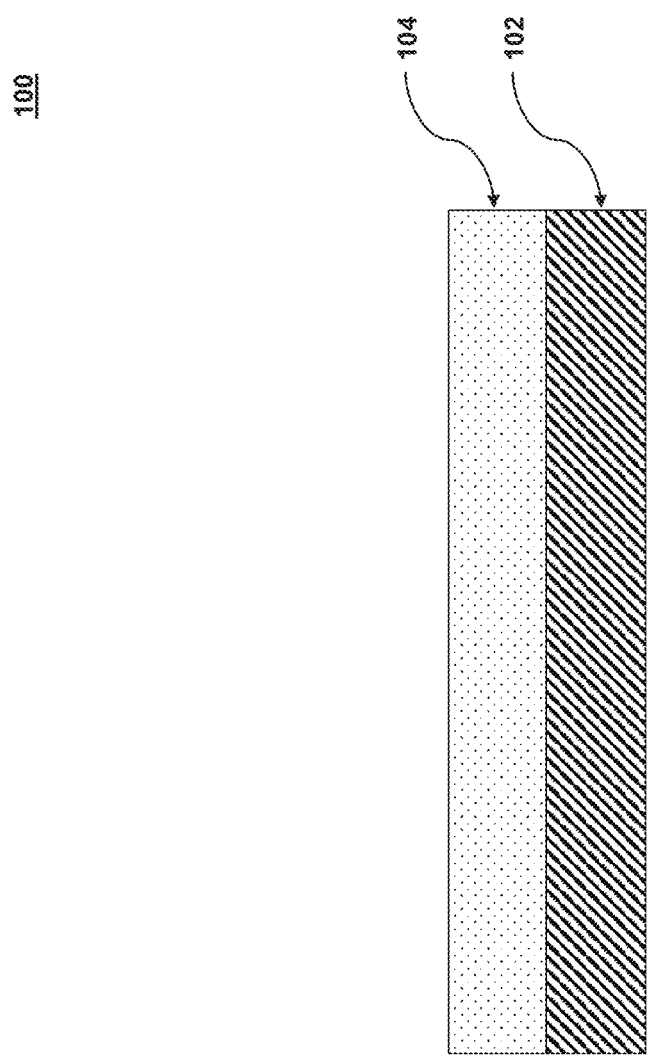
FIG. 1 is a vertical cross-sectional view of an intermediate structure used in the construction of a transistor structure having reduced short channel effects, according to various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

As noted above, in the semiconductor and integrated circuit (IC) industry there is constant desire to reduce the size of ICs to thereby increase areal and volume density of digital circuits. As part of this effort, individual transistors, interconnects, and related structures have become increasingly smaller and there is an ongoing need to develop new materials, processes, and designs of semiconductor devices and interconnects to allow further progress. As devices are made smaller, however, certain device properties may change. For example, field effect transistor devices may exhibit "short channel effects" when the channel length becomes comparable to the depletion widths of source and drain junctions. Short channel effects include undesirable device properties such as a lowering of the threshold voltage and other effects (e.g., punchthrough and drain-induced barrier lowering, surface scattering, velocity saturation, impact ionization, and hot electrons) with decreasing channel lengths. Thin film transistor (TFT) devices based on InGaZnO, for example, may have carrier concentrations in an active layer of the device near source and drain electrodes that may be higher than a carrier concentration in a channel region. As such, carriers may diffuse into the channel region thereby contributing to short channel effects, which may cause roll off and a reduction of the threshold voltage with decreasing channel length.

The various embodiments disclosed herein include structures and fabrication methods that reduce or eliminate short channel effects in field-effect transistor device by including a carrier modification device. The carrier modification device may mitigate the carrier concentration variations in the active layer. The carrier modification device may include a capping layer, an injection layer, or both. For example, in certain embodiments (e.g., described below with reference to FIGS. 5, 10, 20, and 24) a capping layer that is in contact with the active layer, may be provided. The capping layer may act as a carrier donor layer that acts to increases a carrier concentration in the active layer to thereby reduce carrier concentration differences (i.e., gradients) between the active layer and the source and drain regions. In further embodiments (e.g., described below with reference to FIGS. 15 and 29), injection layers may act to reduce the carrier concentration near the source and drain regions of the active layer.

In both embodiments, the carrier modification device, which may include capping layers and injection layers, may act to reduce short channel effects by modifying carrier concentrations in the active layer to thereby reduce carrier concentration gradients. For example, if a certain embodiment has a channel carrier concentration of approximately $1\times10^{16}$ cm$^{-3}$, it would be advantageous to have a carrier concentration in the source and drain regions that is also approximately $1\times10^{16}$ cm$^{-3}$. In certain thin film transistor structures based on InGaZnO, for example, the channel region may have a carrier concentration of approximately $1\times10^{17}$ cm$^{-3}$ and the source and drain regions may have a carrier concentration of approximately $1\times10^{18}$ cm$^{-3}$ or $1\times10^{19}$ cm$^{-3}$. In such a device, a capping layer may be used to increase the channel carrier concentration to reduce the difference between the channel region and the source and drain regions. Alternatively, injection layers may be used to reduce the carrier concentration near the source and drain regions of the active layer to reduce the difference between the channel region and the source and drain regions. Further embodiment devices may include both capping layers and injection layers that collectively act to reduce concentration differences/gradients between the channel region and the source and drain region.

FIG. 1 is a vertical cross-sectional view of an intermediate structure 100 used in the construction of a transistor structure having reduced short channel effects, according to various embodiments. For example, the transistor structure may be a back-gate thin-film transistor (TFT). The intermediate structure 100 may include a gate electrode 102 formed over a substrate (not shown) and an insulating layer 104 formed over the gate electrode 102. The gate electrode 102 may include a gate metal material including, but not limited to, one or more of Mo, Ti/Al/Ti, TiN/W, TaN, and various other metallic alloys. In further embodiments, the gate electrode 102 may include, but is not limited to, any suitable metal, such as copper, aluminum, zirconium, titanium, tungsten, tantalum, ruthenium, palladium, platinum, cobalt, nickel, or alloys thereof. Other suitable gate metal materials are within the contemplated scope of disclosure. The gate electrode 102 may be formed by deposition of a gate metal material using any suitable technique, such as chemical vapor deposition (CVD), plasma enhanced chemical vapor deposition (PECVD), atomic layer deposition (ALD), physical vapor deposition (PVD), etc., followed by a planarization process, for example, by chemical mechanical planarization (CMP). The gate electrode 102 may further be patterned by etching the gate metal material using a patterned photoresist (not shown).

The insulating layer 104 may include, but is not limited to, silicon dioxide, silicon nitride, silicon oxynitride, hafnium oxide, hafnium silicon oxide, hafnium tantalum oxide, hafnium titanium oxide, hafnium zirconium oxide, zirconium oxide, titanium oxide, aluminum oxide, hafnium dioxide-alumina, or various other insulating structures such as a multi-layer stack structure including alternating insulating layers. Other suitable insulating and dielectric materials are within the contemplated scope of disclosure. The insulating layer 104 may be formed by any suitable technique as ALD, CVD, PECVD, PVD, etc.

Figure 2:
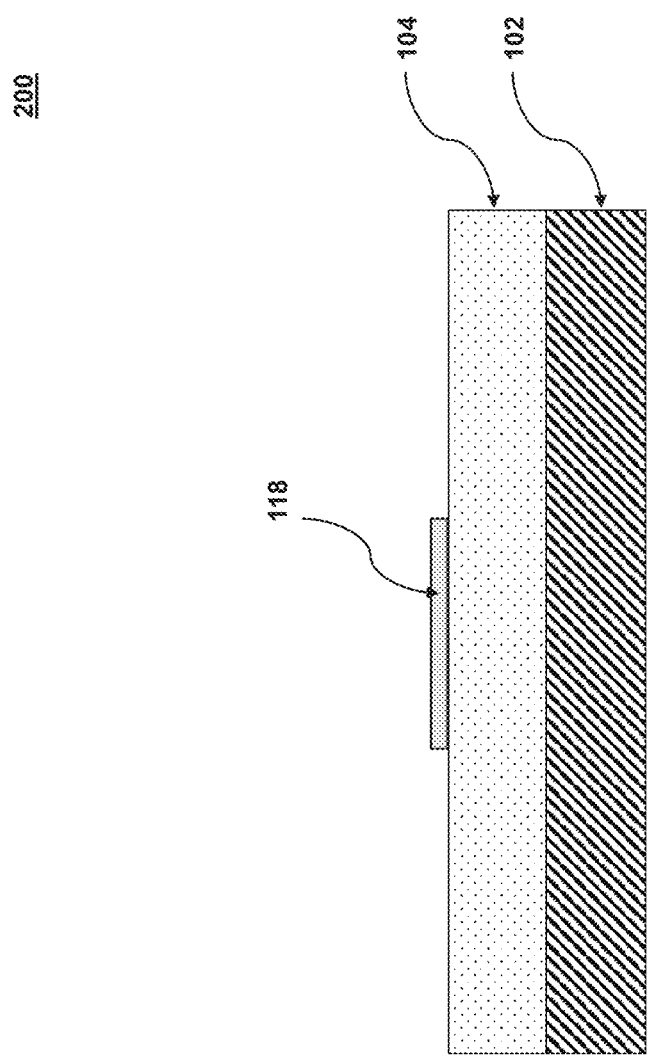
FIG. 2 is a vertical cross-sectional view of a further intermediate structure after formation of a capping layer on the intermediate structure of FIG. 1, according to various embodiments.

FIG. 2 is a vertical cross-sectional view of a further intermediate structure 200 after formation of a capping layer 118 on the intermediate structure 100 of FIG. 1, according to various embodiments. The capping layer 118 may be formed over a top surface of the insulating layer 104. The capping layer 118 may include, but is not limited to, one or more of $InO_x$, $GaO_x$, ZnO, IZO, $CaO_x$/ZnO, ZnO/$GaO_x$, Al, Mo, W, Ti, Ca, oxides thereof, and alloys thereof. Other suitable materials are within the contemplated scope of disclosure. The capping layer 118 may be deposited on the insulating layer 104 by any suitable technique such as ALD, CVD, PECVD, PVD, etc. The capping layer may be patterned by etching deposited capping layer material using a patterned photoresist (not shown).

Figure 3:
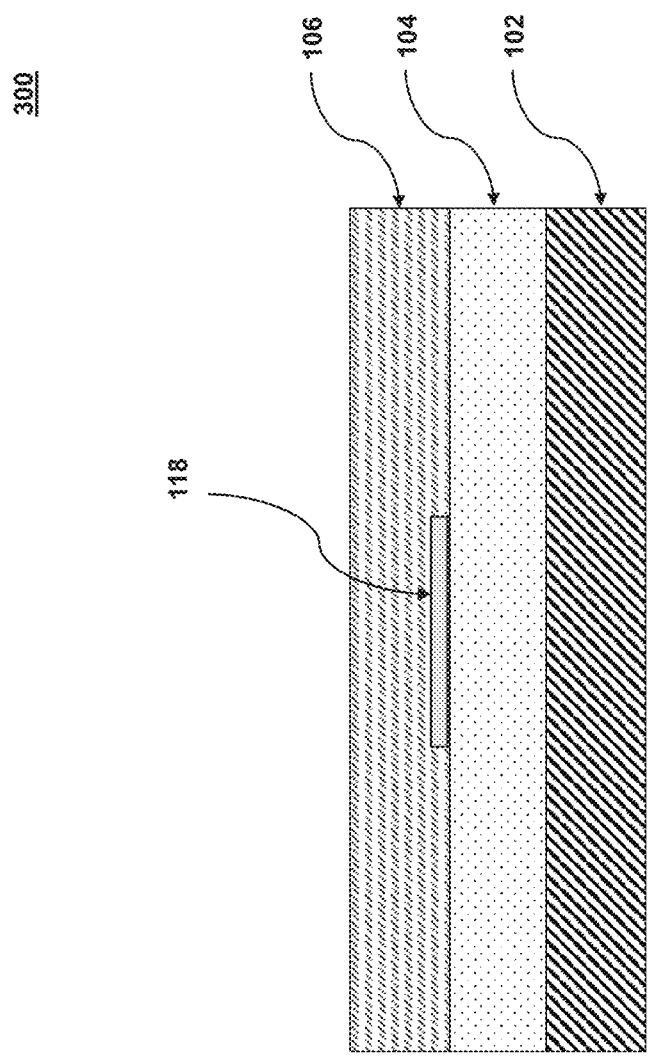
FIG. 3 is a vertical cross-sectional view of a further intermediate structure after forming an active layer over the intermediate structure of FIG. 2, according to various embodiments.

FIG. 3 is a vertical cross-sectional view of a further intermediate structure 300 after forming an active layer 106 over the intermediate structure 200 of FIG. 2, according to various embodiments. The active layer 106 may be a semiconducting material including, but not limited to, amorphous silicon, InGaZnO, InGaO, InWO, InZnO, InSnO, ZnO, GaO, InO, and alloys thereof. Other suitable materials are within the contemplated scope of disclosure. The active layer 106 may be formed by any suitable method such as ALD, CVD, PECVD, PVD, etc.

Figure 4:
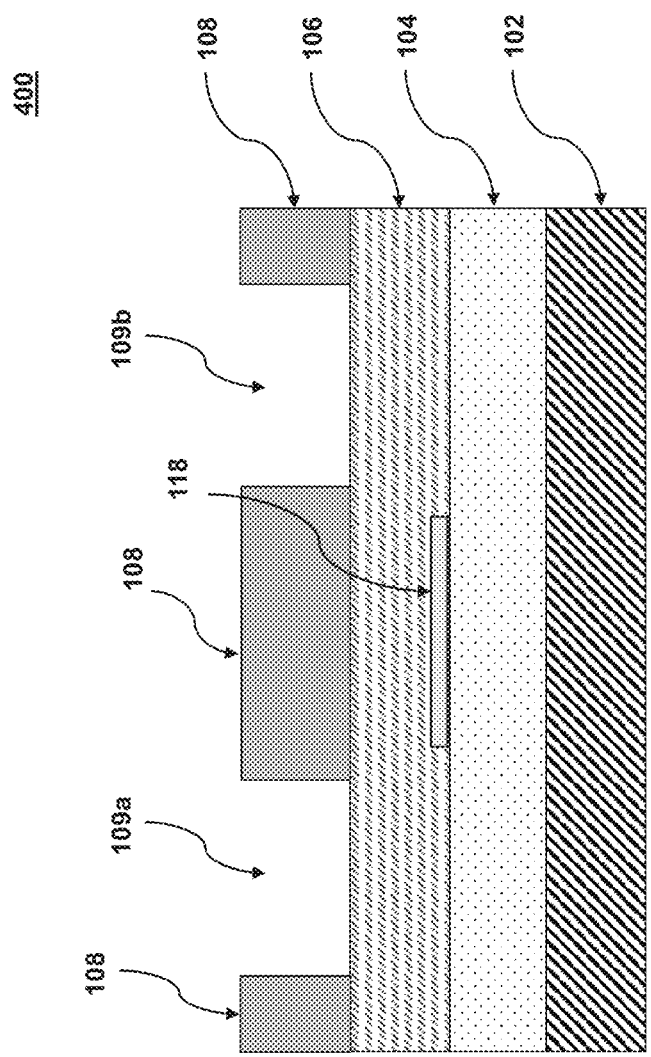
FIG. 4 is a vertical cross-sectional view of a further intermediate structure after formation of a patterned inter-layer dielectric layer over the intermediate structure of FIG. 3, according to various embodiments.

FIG. 4 is a vertical cross-sectional view of a further intermediate structure 400 after formation of a patterned inter-layer dielectric layer 108 over the intermediate structure 300 of FIG. 3, according to various embodiments. The inter-layer dielectric layer 108 may include, but is not limited to, silicon dioxide, silicon nitride, silicon oxynitride, hafnium oxide, hafnium silicon oxide, hafnium tantalum oxide, hafnium titanium oxide, hafnium zirconium oxide, zirconium oxide, titanium oxide, aluminum oxide, hafnium dioxide-alumina, or various other insulating structures such as a multi-layer stack structure including alternating insulating layers. The inter-layer dielectric layer 108 may be deposited by any suitable technique as ALD, CVD, PECVD, PVD, etc.

The inter-layer dielectric layer 108 may be planarized (e.g., using CMP) and patterned to form a first via cavity 109a and a second via cavity 109b. In this regard a photoresist (not shown) may be deposited over the inter-layer dielectric layer 108 and may be patterned using photolithographic techniques. The patterned photoresist may then be used to etch unmasked regions of the inter-layer dielectric layer 108 to thereby form the first via cavity 109a and the second via cavity 109b. The photoresist may be removed, for example, by ashing.

Figure 5:
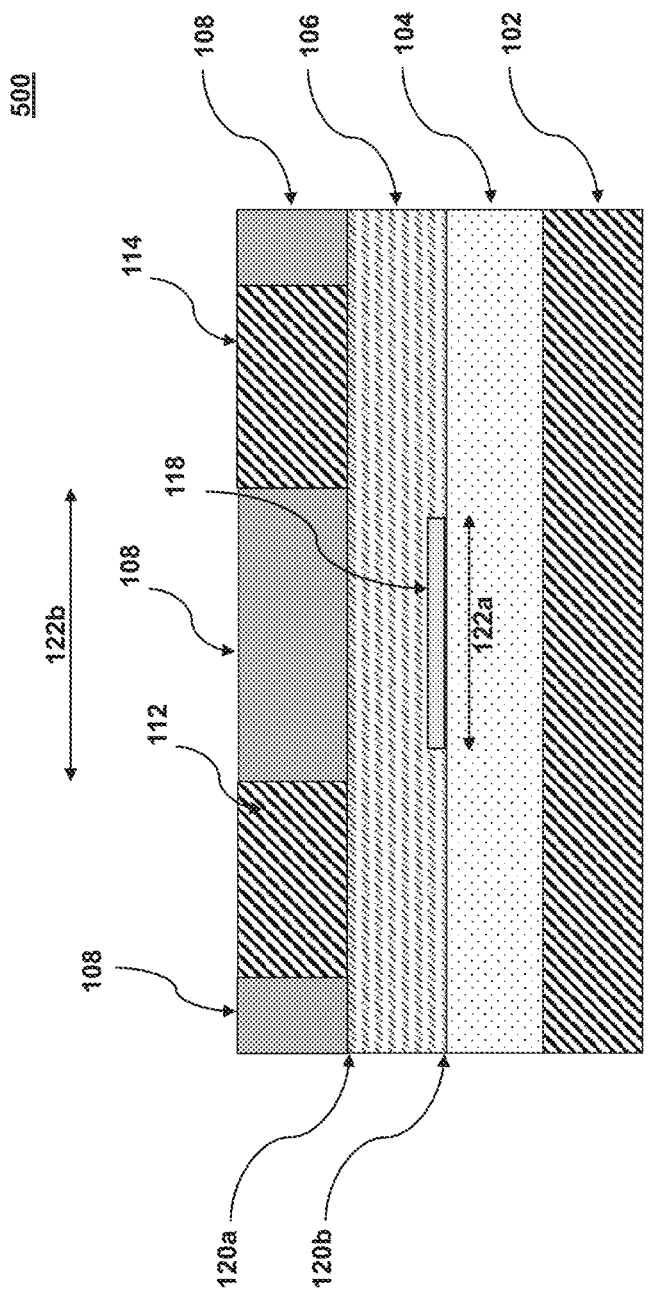
FIG. 5 is a vertical cross-sectional view of an embodiment transistor structure after formation of a source electrode and a drain electrode in via cavities of the intermediate structure of FIG. 4, according to various embodiments.

FIG. 5 is a vertical cross-sectional view of an embodiment transistor structure 500, for example, a back gate TFT structure, after formation of a source electrode 112 and a drain electrode 114 respectively in the first via cavity 109a and the second via cavity 109b of the intermediate structure 400 of FIG. 4, according to various embodiments. The source electrode 112 and drain electrode 114 may formed by depositing a conductive material into the first via cavity 109a and the second via cavity 109b, respectively. The conductive material deposited into the first via cavity 109a to form the source electrode 112 and into the second via cavity 109b to form the drain electrode 114 may include a metallic liner material and a metallic fill material. The metallic liner material may include a conductive metallic nitride or a conductive metallic carbide such as TiN, TiN/W, Ti/Al/Ti, TaN, WN, TiC, TaC, and/or WC. The metallic fill material may include W, Cu, Al, Co, Ru, Mo, Ta, Ti, alloys thereof, and/or combinations thereof. Other suitable metallic liner and metallic fill materials within the contemplated scope of this disclosure may also be used.

The metallic liner material and metallic fill materials may be formed by suitable deposition process, which may include one or more of a CVD process, a PVD process, an ALD process, an electroplating process, etc. Other suitable deposition processes are within the contemplated scope of disclosure. Excess portions of the conductive material may be removed from above a horizontal plane including the top surface of the inter-layer dielectric layer 108 by a planarization process. The planarization process may include use of a CMP process although other suitable planarization processes may be used.

As shown in FIG. 5, the active layer 106 has a top surface 120a, which is proximal to the source electrode 112 and the drain electrode 114, and a bottom surface 120b, which is distal to the source electrode 112 and the drain electrode 114. The source electrode 112 and the drain electrode 114 may be each disposed on the top surface 120a of the active layer 106. The gate electrode 102 may be disposed proximal to the bottom surface 120b of the active layer 106 and distal to the top surface 120a of the active layer 106 such that the transistor structure 500 is configured as a back gate structure. Also, as shown in FIG. 5, the capping layer 118 may be configured to be in contact with the active layer 106. In this example, the capping layer 118 may be in contact with the bottom surface 120b of the active layer 106. In other embodiments, the capping layer 118 may be configured on the top surface 120a of the active layer 106, as described in greater detail below with reference to FIGS. 8 to 10.

The capping layer 118 (e.g., see FIG. 5) may be configured symmetrically relative to the source electrode 112 and the drain electrode 114. Further, the width 122a of the capping layer may be chosen to be smaller than a distance 122b between the source electrode 112 and the drain electrode 114. The capping layer 118 may have a first value of electronegativity and the insulating layer 104 may have a second value of electronegativity. The material used to form the capping layer 118 and insulating layer 104 may each be chosen such that the first value of electronegativity is less than the second value of electronegativity. As such, the presence of the capping layer 118 may act to increase a carrier concentration within the active layer 106 relative to a carrier concentration that would exist in the active layer 106 absent the presence of the capping layer 118. Put another way, the capping layer 118 may the provide additional carriers to diffuse into the active layer 106 so as to increase the carrier concentration within the active layer 106 in the regions of the active layer 106 surrounding the capping layer 118. In this way, carrier concentration gradients between the channel region and the source and drain regions of the active layer may be reduced.

The capping layer 118 may have various thicknesses based on the material chosen for the capping layer 118. For example, in embodiments in which the capping layer includes an oxide material, the capping layer may have a thickness in a range from 0.1 nm to 1 nm, from 0.5 nm to 2 nm, from 1 nm to 3 nm, or from 2 nm to 10 nm. In embodiments in which the capping layer 118 include a metal, the capping layer may have a thickness in a range from 1 nm to 20 nm, from 10 nm to 50 nm, or from 30 nm to 100 nm, 50 nm to 150 nm, 100 nm to 200 nm, 150 nm to 300 nm, or 200 nm to 500 nm. The thickness of the capping layer 118 may be chosen to optimize the diffusion of carriers into the active layer 106.

Figure 6:
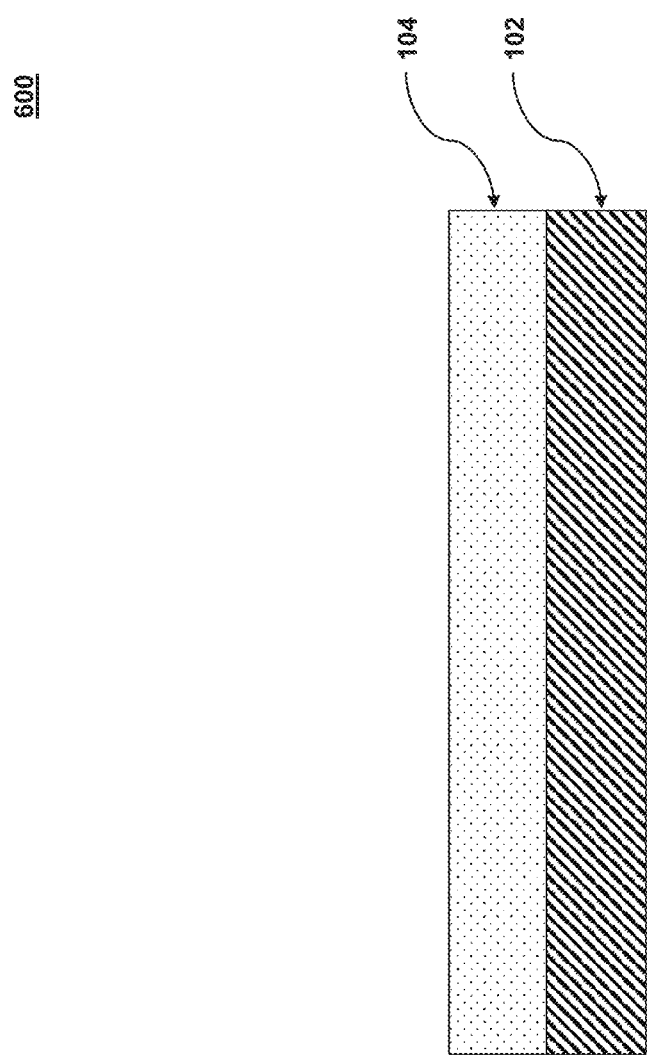
FIG. 6 is a vertical cross-sectional view of an intermediate structure used in the construction of a further transistor structure having reduced short channel effects, according to various embodiments.

FIG. 6 is a vertical cross-sectional view of an intermediate structure 600 used in the construction of a further transistor structure having reduced short channel effects, according to various embodiments. The transistor structure 600 may include a gate electrode 102 formed over a substrate (not shown) and an insulating layer 104 formed over the gate electrode 102. The gate electrode 102 may include a gate metal material including, but not limited to, one or more of Mo, Ti/Al/Ti, TiN/W, TaN, and various other metallic alloys. In further embodiments, the gate electrode 102 may include, but is not limited to, any suitable metal, such as copper, aluminum, zirconium, titanium, tungsten, tantalum, ruthenium, palladium, platinum, cobalt, nickel, or alloys thereof. Other suitable gate metal materials are within the contemplated scope of disclosure.

The gate electrode 102 may be formed by deposition of a gate metal material using any suitable technique, such as CVD, PECVD, ALD, PVD, etc., followed by a planarization process, for example, by CMP. The gate electrode 102 may further be patterned by etching the gate metal material using a patterned photoresist (not shown). The insulating layer 104 may include, but is not limited to, silicon dioxide, silicon nitride, silicon oxynitride, hafnium oxide, hafnium silicon oxide, hafnium tantalum oxide, hafnium titanium oxide, hafnium zirconium oxide, zirconium oxide, titanium oxide, aluminum oxide, hafnium dioxide-alumina, or various other insulating structures such as a multi-layer stack structure including alternating insulating layers. Other suitable insulating materials are within the contemplated scope of disclosure. The insulating layer 104 may be formed by any suitable technique as ALD, CVD, PECVD, PVD, etc.

Figure 7:
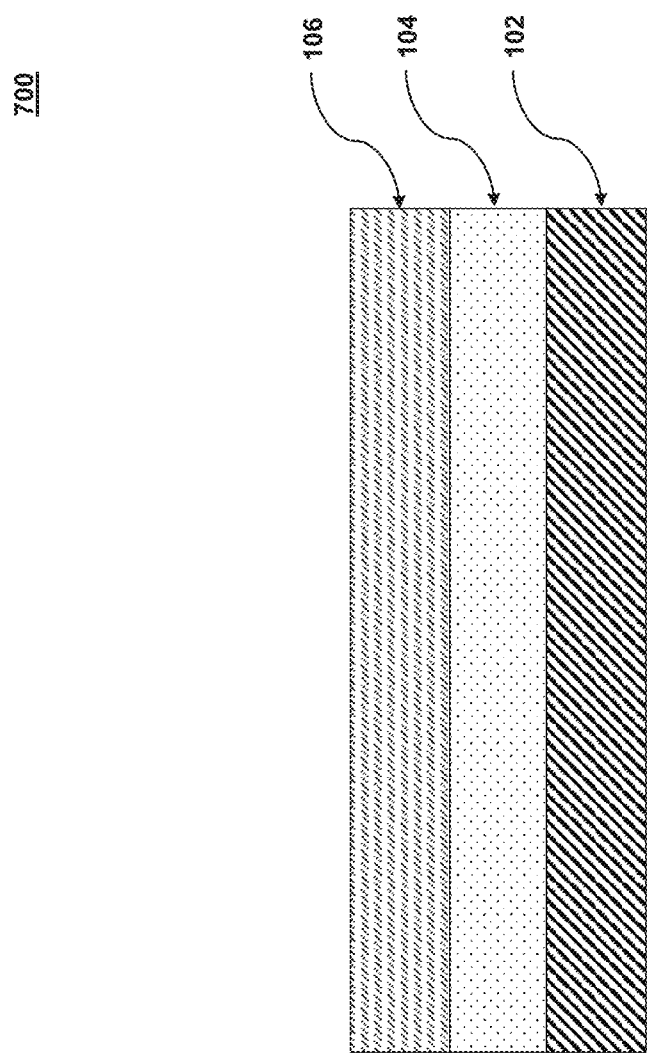
FIG. 7 is a vertical cross-sectional view of a further intermediate structure after forming an active layer over the intermediate structure of FIG. 7, according to various embodiments.

FIG. 7 is a vertical cross-sectional view of a further intermediate structure 700 after forming an active layer 106 over the intermediate structure 600 of FIG. 6, according to various embodiments. The active layer 106 may be a semiconducting material including, but not limited to, amorphous silicon, InGaZnO, InGaO, InWO, InZnO, InSnO, ZnO, GaO, InO, and alloys thereof. Other suitable semiconducting materials are within the contemplated scope of disclosure. The active layer 106 may be formed by any suitable method such as ALD, CVD, PECVD, PVD, etc.

Figure 8:
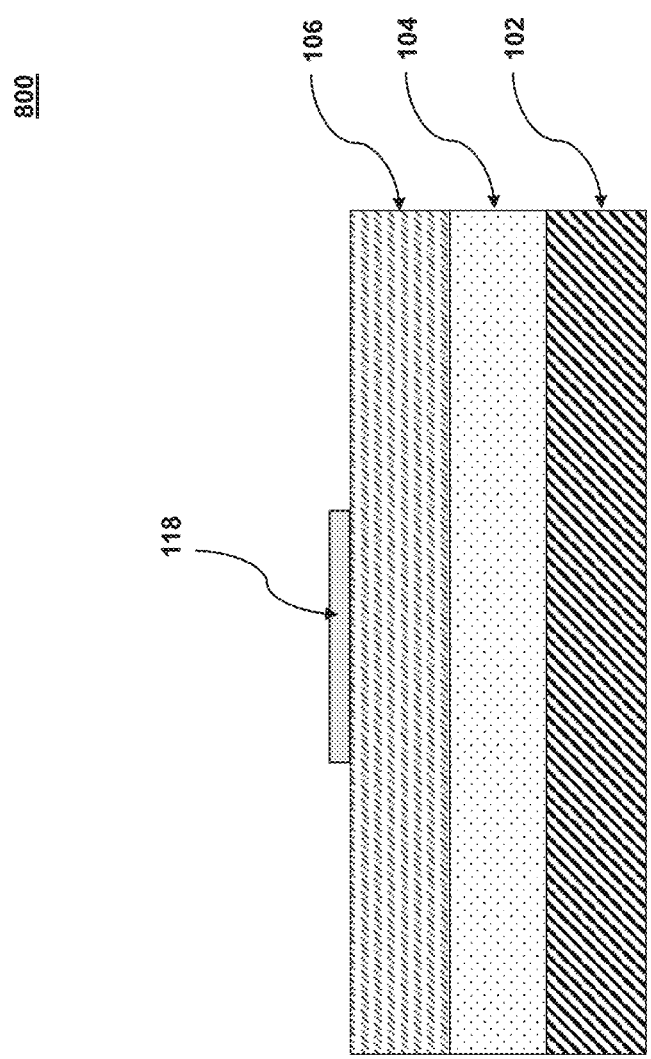
FIG. 8 is a vertical cross-sectional view of a further intermediate structure after formation of a capping layer on the intermediate structure of FIG. 6, according to various embodiments.

FIG. 8 is a vertical cross-sectional view of a further intermediate structure 800 after formation of a capping layer 118 on the intermediate structure of FIG. 6, according to various embodiments. The capping layer 118 may be formed over a top surface of the active layer 106. The capping layer 118 may include, but is not limited to, one or more of $InO_x$, $GaO_x$, ZnO, IZO, $CaO_x/ZnO$, $ZnO/GaO_x$, Al, Mo, W, Ti, Ca, oxides thereof, and alloys thereof. Other suitable materials are within the contemplated scope of disclosure. The capping layer 118 may be deposited on the active layer 106 by any suitable technique such as ALD, CVD, PECVD, PVD, etc. The capping layer 118 may be patterned by etching deposited capping layer material using a patterned photoresist (not shown).

Figure 9:
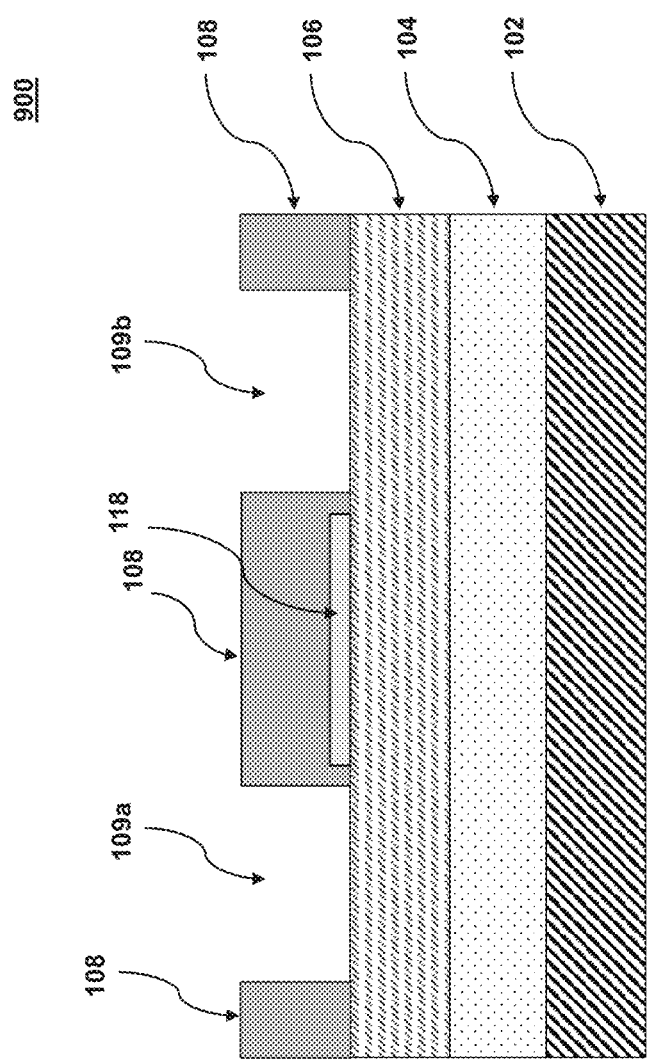
FIG. 9 is a vertical cross-sectional view of a further intermediate structure after formation of a patterned inter-layer dielectric layer over the intermediate structure of FIG. 8, according to various embodiments.

FIG. 9 is a vertical cross-sectional view of a further intermediate structure 900 after formation of a patterned inter-layer dielectric layer 108 over the intermediate structure 800 of FIG. 8, according to various embodiments. The inter-layer dielectric layer 108 may include, but is not limited to, silicon dioxide, silicon nitride, silicon oxynitride, hafnium oxide, hafnium silicon oxide, hafnium tantalum oxide, hafnium titanium oxide, hafnium zirconium oxide, zirconium oxide, titanium oxide, aluminum oxide, hafnium dioxide-alumina, or various other insulating structures such as a multi-layer stack structure including alternating insulating layers. The inter-layer dielectric layer 108 may be deposited by any suitable technique as ALD, CVD, PECVD, PVD, etc.

After deposition, the inter-layer dielectric layer 108 may be planarized (e.g., using CMP) and then patterned to form a first via cavity 109a and a second via cavity 109b. In this regard a photoresist (not shown) may be deposited over the inter-layer dielectric layer 108 and may be patterned using photolithographic techniques. The patterned photoresist may then be used to etch unmasked regions of the inter-layer dielectric layer 108 to thereby form the first via cavity 109a and the second via cavity 109b. After the first via cavity 109a and the second via cavity 109b may be formed, the photoresist may be removed, for example, by ashing.

Figure 10:
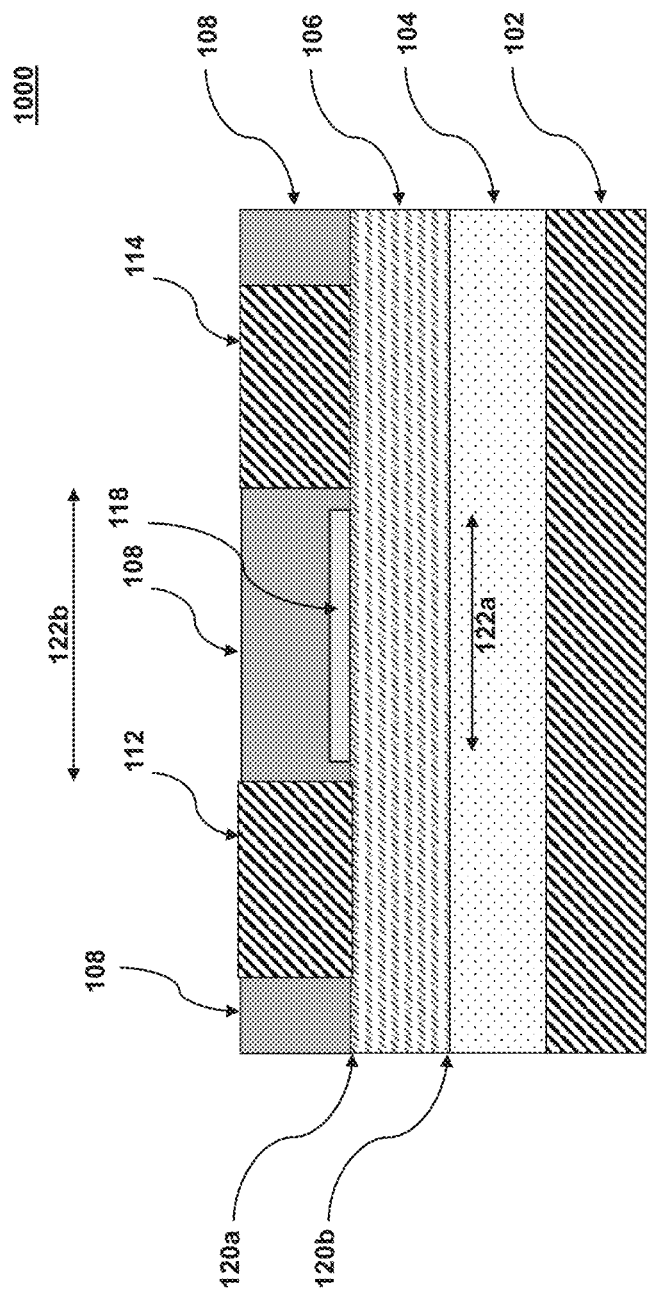
FIG. 10 is a vertical cross-sectional view of an embodiment transistor structure after formation of a source electrode and a drain electrode in via cavities of the intermediate structure of FIG. 9, according to various embodiments.

FIG. 10 is a vertical cross-sectional view of an embodiment transistor structure 1000 (e.g., back gate TFT) after formation of a source electrode 112 and a drain electrode 114 respectively in the first via cavity 109a and the second via cavity 109b of the intermediate structure 900 of FIG. 9, according to various embodiments. The source electrode 112 and drain electrode 114 may formed by depositing a conductive material into the first via cavity 109a and the second via cavity 109b, respectively. The conductive material deposited into the first via cavity 109a to form the source electrode 112 and into the second via cavity 109b to form the drain electrode 114 may include a metallic liner material and a metallic fill material. The metallic liner material may include a conductive metallic nitride or a conductive metallic carbide such as TiN, TiN/W, Ti/Al/Ti, TaN, WN, TiC, TaC, and/or WC. The metallic fill material may include W, Cu, Al, Co, Ru, Mo, Ta, Ti, alloys thereof, and/or combinations thereof. Other suitable metallic liner and metallic fill materials within the contemplated scope of this disclosure may also be used.

The metallic liner material and metallic fill materials may be formed by suitable deposition process, which may include one or more of a CVD process, a PVD process, an ALD process, an electroplating process, etc. Other suitable deposition processes are within the contemplated scope of disclosure. Excess portions of the conductive material may be removed from above a horizontal plane including the top surface of the inter-layer dielectric layer 108 by a planarization process. The planarization process may include use of a CMP process although other suitable planarization processes may be used.

As shown in FIG. 10, the active layer 106 may have a top surface 120a, which may be proximal to the source electrode 112 and the drain electrode 114, and a bottom surface 120b, which may be distal to the source electrode 112 and the drain electrode 114. The source electrode 112 and the drain electrode 114 may each be disposed on the top surface 120a of the active layer 106. The gate electrode 102 may be disposed closer to the bottom surface 120b of the active layer 106 than to the top surface 120a of the active layer 106 such that the transistor structure 1000 is configured as a back gate structure. Also, as shown in FIG. 10, the capping layer 118 may be configured to be in contact with the active layer 106. In this example, the capping layer 118 may be in contact with the top surface 120a of the active layer 106. As described above with reference to FIG. 5, the capping layer 118 may also be disposed in contact with the bottom surface 120b of the active layer 106 in other embodiments.

The capping layer 118 (e.g., see FIG. 10) may be positioned symmetrically relative to the source electrode 112 and the drain electrode 114. Further, the width 122a of the capping layer may be chosen to be smaller than a distance 122b between the source electrode 112 and the drain electrode 114. The capping layer 118 may have a first value of electronegativity and the insulating layer 104 may have a second value of electronegativity. The material used to form the capping layer 118 and insulating layer 104 may each be chosen such that the first value of electronegativity is less than the second value of electronegativity. As such, the presence of the capping layer 118 may act to increase a carrier concentration within the active layer 106 relative to a carrier concentration that would exist in the active layer 106 in the absence of the capping layer 118. Put another way, the capping layer 118 may the provide additional carriers to diffuse into the active layer 106 so as to increase the carrier concentration within the active layer 106 in the regions of the active layer 106 surrounding the capping layer 118. In this way, carrier concentration gradients between the channel region and the source and drain regions of the active layer may be reduced.

The capping layer 118 may have various thicknesses based on the material chosen for the capping layer 118. For example, in embodiments in which the capping layer include an oxide material, the capping layer may have a thickness in a range from 0.1 nm to 1 nm, from 0.5 nm to 2 nm, from 1 nm to 3 nm, or from 2 nm to 10 nm. In embodiments in which the capping layer 118 include a metal, the capping layer may have a thickness in a range from 1 nm to 20 nm, from 10 nm to 50 nm, or from 30 nm to 100 nm, 50 nm to 150 nm, 100 nm to 200 nm, 150 nm to 300 nm, or 200 nm to 500 nm. The thickness of the capping layer 118 may be chosen to optimize the diffusion of carriers into the active layer 106.

Figure 11:
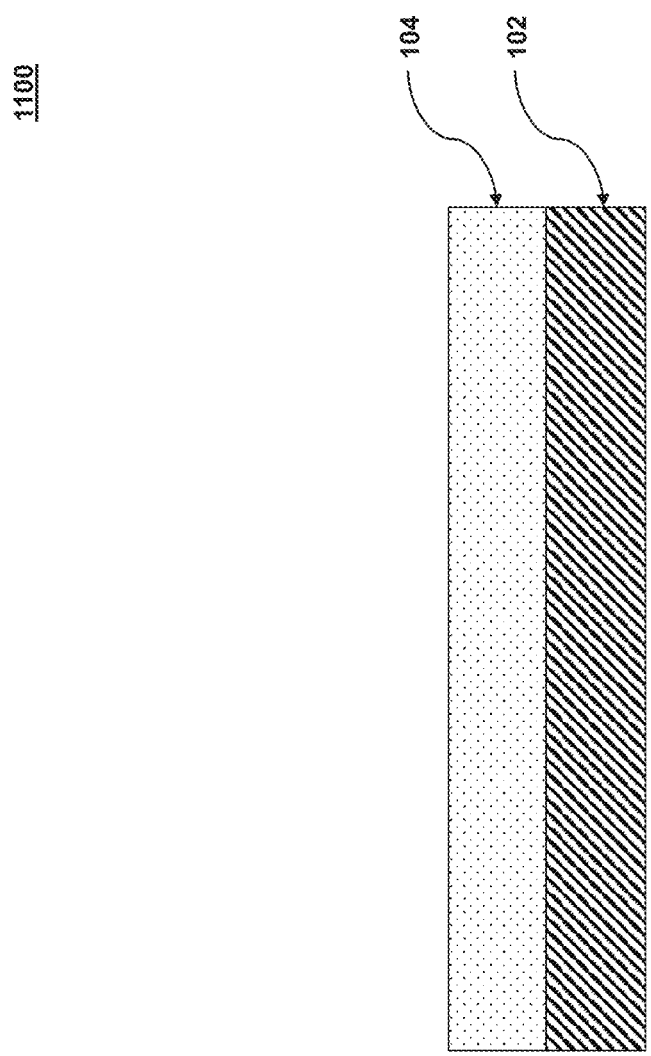
FIG. 11 is a vertical cross-sectional view of an intermediate structure used in the construction of a further transistor structure having reduced short channel effects, according to various embodiments.

FIG. 11 is a vertical cross-sectional view of an intermediate structure 1100 used in the construction of a further transistor structure having reduced short channel effects, according to various embodiments. The structure 1100 may include a gate electrode 102 formed over a substrate (not shown) and an insulating layer 104 formed over the gate electrode 102. The gate electrode 102 may include materials similar to those of gate electrodes 102 described above with reference to FIGS. 1 and 6 and may be manufactured using similar processes. The structure 1100 may further include an insulating layer 104. The insulating layer 104 may include materials similar to those of insulating layers 104 described above with reference to FIGS. 1 and 6 and may be manufactured using similar processes.

Figure 12:
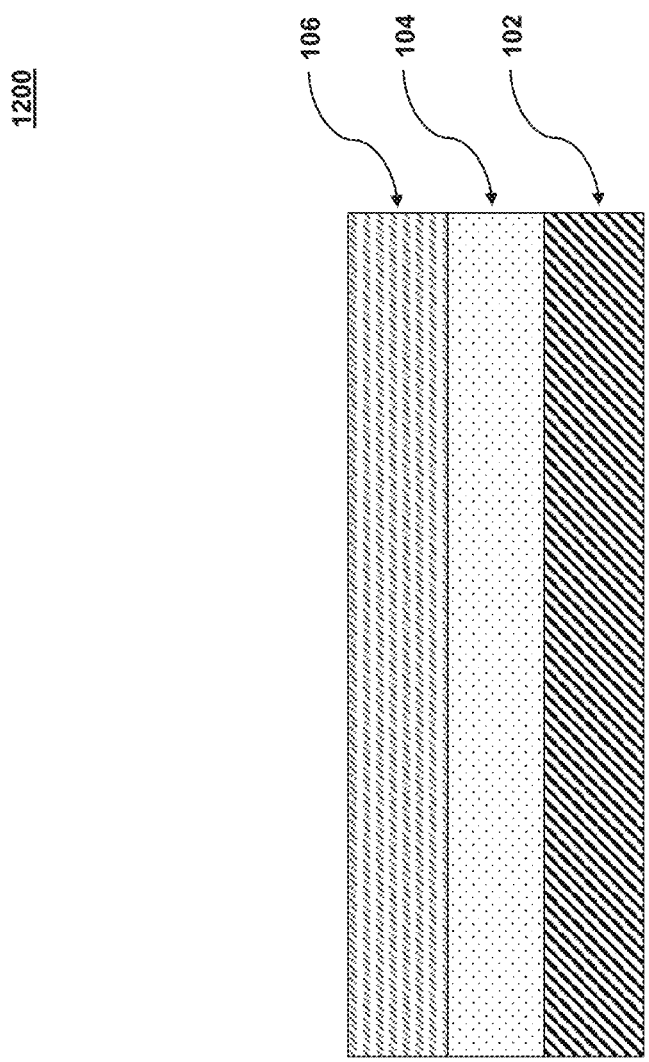
FIG. 12 is a vertical cross-sectional view of a further intermediate structure after forming an active layer over the intermediate structure of FIG. 11, according to various embodiments.

FIG. 12 is a vertical cross-sectional view of a further intermediate structure 1200 after forming an active layer 106 over the intermediate structure 1100 of FIG. 11, according to various embodiments. The active layer 106 may be a semiconducting material including, but not limited to, amorphous silicon, InGaZnO, InGaO, InWO, InZnO, InSnO, ZnO, GaO, InO, and alloys thereof. Other suitable materials are within the contemplated scope of disclosure. The active layer 106 may be formed by any suitable method such as ALD, CVD, PECVD, PVD, etc.

Figure 13:
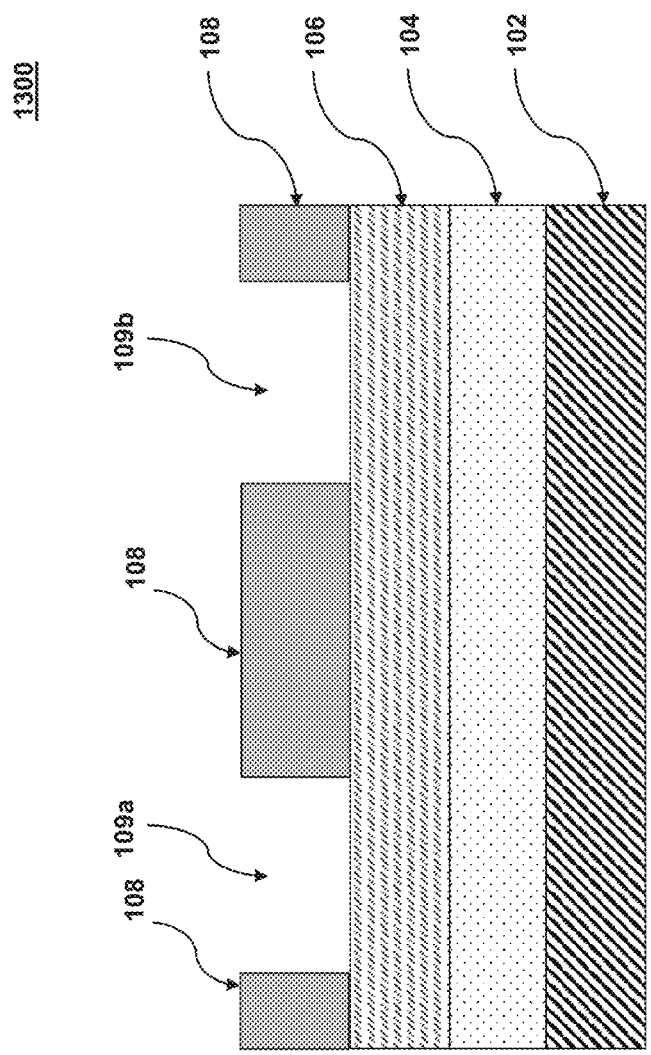
FIG. 13 is a vertical cross-sectional view of a further intermediate structure after formation of a patterned inter-layer dielectric layer over the intermediate structure of FIG. 12, according to various embodiments.

FIG. 13 is a vertical cross-sectional view of a further intermediate structure 1300 after formation of a patterned inter-layer dielectric layer 108 over the intermediate structure 1200 of FIG. 12, according to various embodiments. The inter-layer dielectric layer 108 may include materials similar to those of inter-layer dielectric layers 108 described above with reference to FIGS. 4 and 9 and may be manufactured using similar processes. After deposition, the inter-layer dielectric layer 108 may be planarized (e.g., using CMP) and then patterned to form a first via cavity 109a and a second via cavity 109b. In this regard a photoresist (not shown) may be deposited over the inter-layer dielectric layer 108 and may be patterned using photolithographic techniques. The patterned photoresist may then be used to etch unmasked regions of the inter-layer dielectric layer 108 to thereby form the first via cavity 109a and the second via cavity 109b. After the first via cavity 109a and the second via cavity 109b may be formed, the photoresist may be removed, for example, by ashing.

Figure 14:
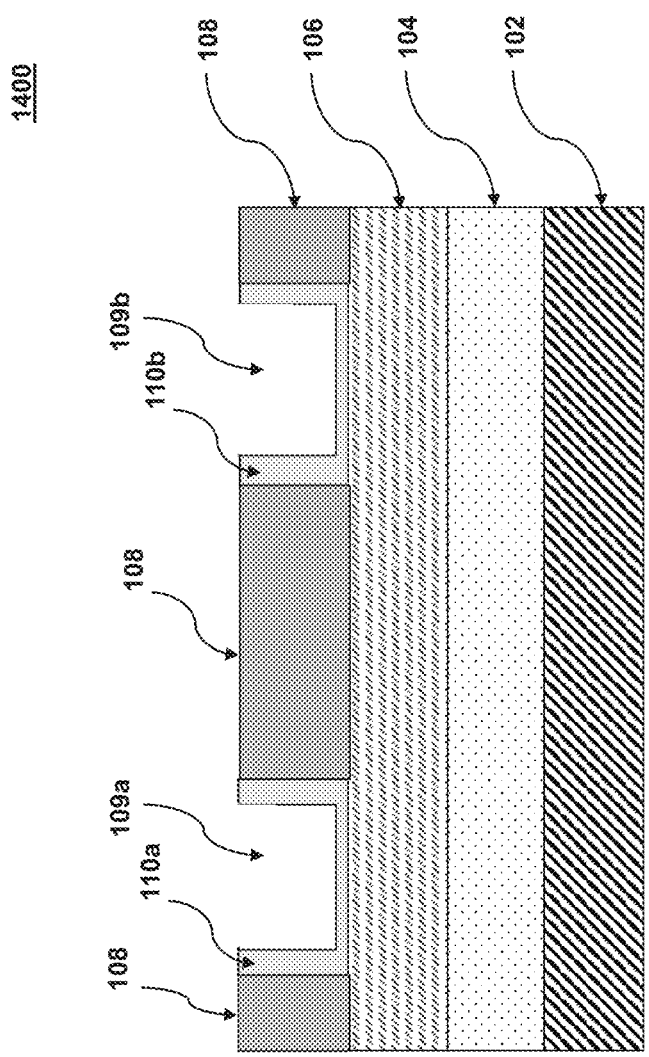
FIG. 14 is a vertical cross-sectional view of a further intermediate structure after formation of a first injection layer and a second injection layer in via cavities of the intermediate structure of FIG. 13, according to various embodiments.

FIG. 14 is a vertical cross-sectional view of a further intermediate structure 1400 after formation of a first injection layer 110a and a second injection layer 110b respectively in the first via cavity 109a and the second via cavity 109b of the intermediate structure 1300 of FIG. 13, according to various embodiments. The first injection layer 110a and the second injection layer 110b may be formed by conformally forming respective layers of one or more of $InO_x$, InGaZnO, InZnO, $CaO_x$, ZnO, $CaO_x$/ZnO, ZnO/$GaO_x$, TiN, TaN, Au, Pt, Ru, and alloys thereof. The first injection layer 110a and the second injection layer 110b may be formed by any suitable method such as ALD, CVD, PECVD, PVD, etc.

The first injection layer 110a and the second injection layer 110b may be chosen to have various thicknesses depending on the material used to form the first injection layer 110a and the second injection layer 110b. For example, the first injection layer 110a and the second injection layer 110b may each include an oxide material having a thickness in a range from 0.1 nm to 1 nm, from 0.5 nm to 2 nm, from 1 nm to 3 nm, or from 2 nm to 10 nm. Alternatively, the first injection layer 110a and the second injection layer 110b may each include a metal or a nitride material and have a thickness in a range from 1 nm to 20 nm, from 3 nm to 12 nm, or from 5 nm to 10 nm. The thickness of the first injection layer 110a and the second injection layer 110b may be chosen to reduce the carrier concentrations in the active layer 106 in the area surrounding the source electrode 112 and drain electrode 114.

Figure 15:
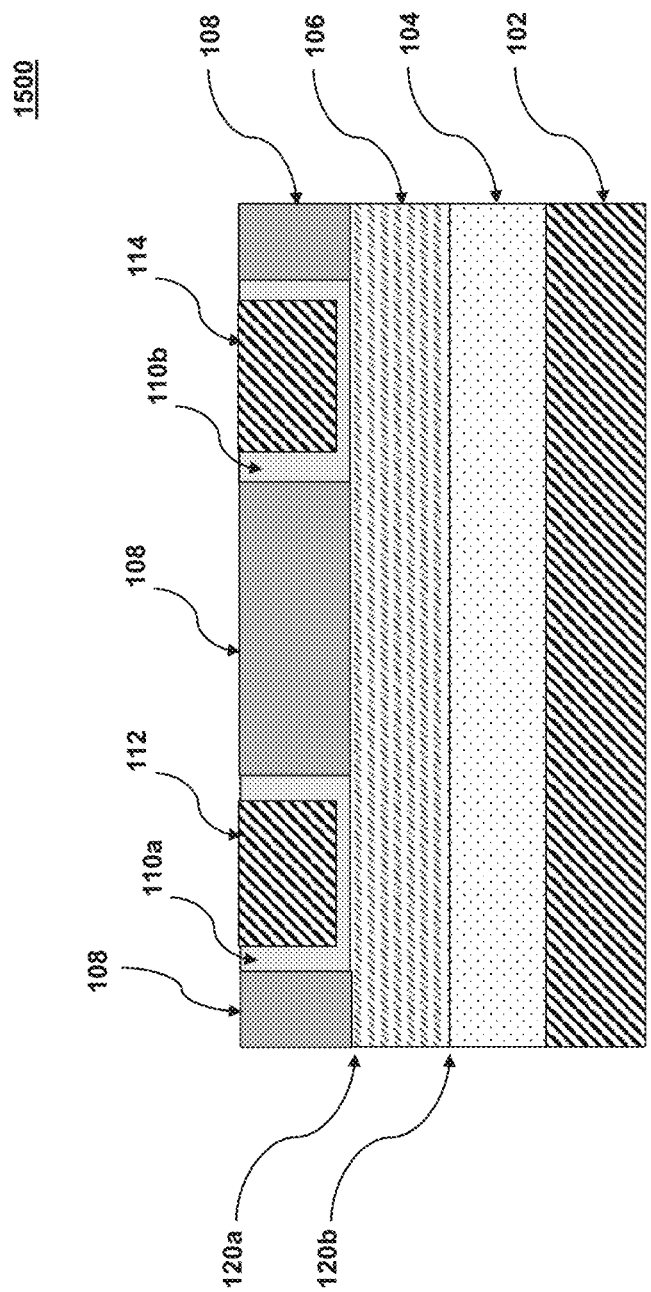
FIG. 15 is a vertical cross-sectional view of an embodiment transistor structure after formation of a source electrode and a drain electrode over the first injection layer and the second injection layer, respectively, of the intermediate structure of FIG. 14, according to various embodiments.

FIG. 15 is a vertical cross-sectional view of an embodiment transistor structure 1500 (e.g., back gate TFT) after formation of a source electrode 112 and a drain electrode 114 respectively over the first injection layer 110a and the second injection layer 110b of the intermediate structure 1400 of FIG. 14, according to various embodiments. The source electrode 112 and the drain electrode 114 may include materials similar to those of source electrodes 112 and the drain electrodes 114 described above with reference to FIGS. 5 and 10 and may be manufactured using similar processes.

In further embodiments, the first injection layer 110a and the second injection layer 110b each include a material having a first value of electronegativity and the source electrode 112 and the drain electrode 114 may each have a second value of electronegativity. The material forming the first injection layer 110a and the second injection layer 110b may be chosen such that the first value of electronegativity (i.e., the electronegativity of the first injection layer 110a and the second injection layer 110b) is greater than the second value of electronegativity (i.e., the electronegativity of the source electrode 112 and the drain electrode 114). As such, first injection layer 110a and the second injection layer 110b act to reduce a carrier concentration within the active layer 106 respectively near the source electrode 112 and near the drain electrode 114 relative to corresponding carrier concentrations that would exist in the active layer 106 if the source electrode 112 and the drain electrode 114 were in direct contact with the active layer 106, without the presence of the first injection layer 110a and the second injection layer 110b. In this way, carrier concentration gradients between the channel region and the source and drain regions of the active layer may be reduced.

As shown in FIG. 15, the active layer 106 may have a top surface 120a, which is proximal to the source electrode 112 and the drain electrode 114, and a bottom surface 120b, which is distal to the source electrode 112 and the drain electrode 114. The source electrode 112 and the drain electrode 114 are each disposed on the top surface 120a of the active layer 106, and the gate electrode 102 is disposed closer to the bottom surface 120b of the active layer 106 than to the top surface 120a of the active layer 106 such that the transistor structure 500 may be configured as a back gate structure.

Figure 16:
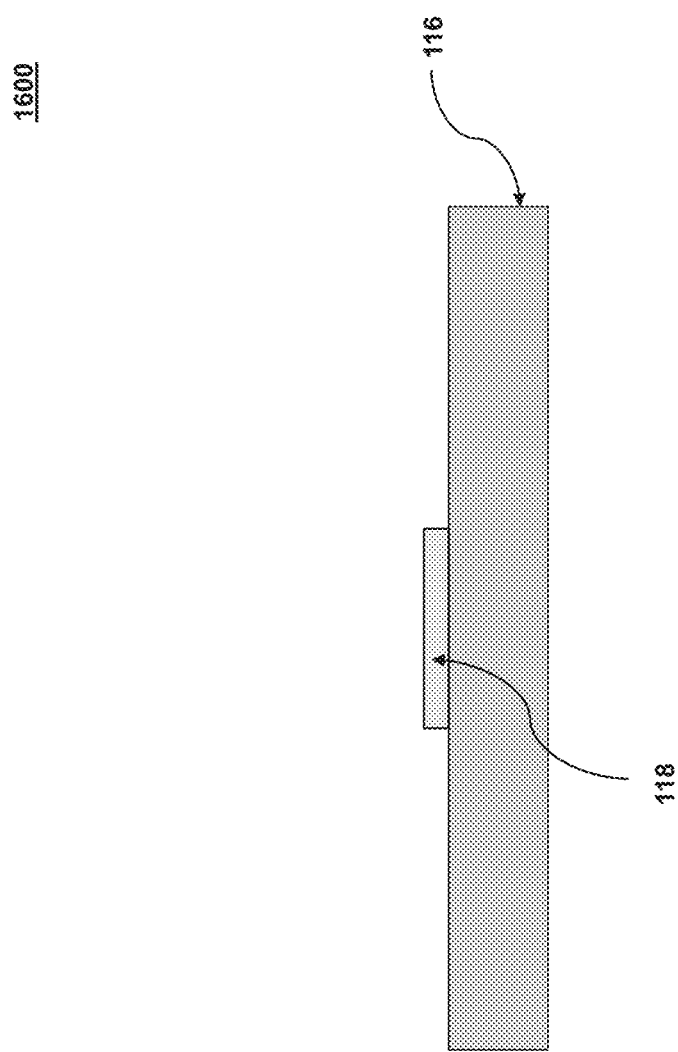
FIG. 16 is a vertical cross-sectional view of an intermediate structure used in the construction of a transistor structure having reduced short channel effects, according to various embodiments.

FIG. 16 is a vertical cross-sectional view of an intermediate structure 1600 used in the construction of another transistor structure (e.g., front gate TFT) having reduced short channel effects, according to various embodiments. The structure 1600 may include a buffer layer 116 formed over a substrate (not shown) and a capping layer 118. The buffer layer 116 may include, but is not limited to, silicon dioxide, silicon nitride, silicon oxynitride, hafnium oxide, hafnium silicon oxide, hafnium tantalum oxide, hafnium titanium oxide, hafnium zirconium oxide, zirconium oxide, titanium oxide, aluminum oxide, hafnium dioxide-alumina, or various other insulating structures such as a multi-layer stack structure including alternating insulating layers. The buffer layer 116 may be deposited by any suitable technique as ALD, CVD, PECVD, PVD, etc. Other suitable buffer layer materials are within the contemplated scope of disclosure.

The capping layer 118 may be formed over a top surface of the buffer layer 116. The capping layer 118 may include, but is not limited to, one or more of $InO_x$, $GaO_x$, ZnO, IZO, $CaO_x/ZnO$, $ZnO/GaO_x$, Al, Mo, W, Ti, Ca, oxides thereof, and alloys thereof. Other suitable materials are within the contemplated scope of disclosure. The capping layer 118 may be deposited on the insulating layer 104 by any suitable technique such as ALD, CVD, PECVD, PVD, etc. The capping layer 118 may be patterned by etching deposited capping layer material using a patterned photoresist (not shown). After the capping layer 118 is formed, the photoresist may be removed, for example, by ashing.

Figure 17:
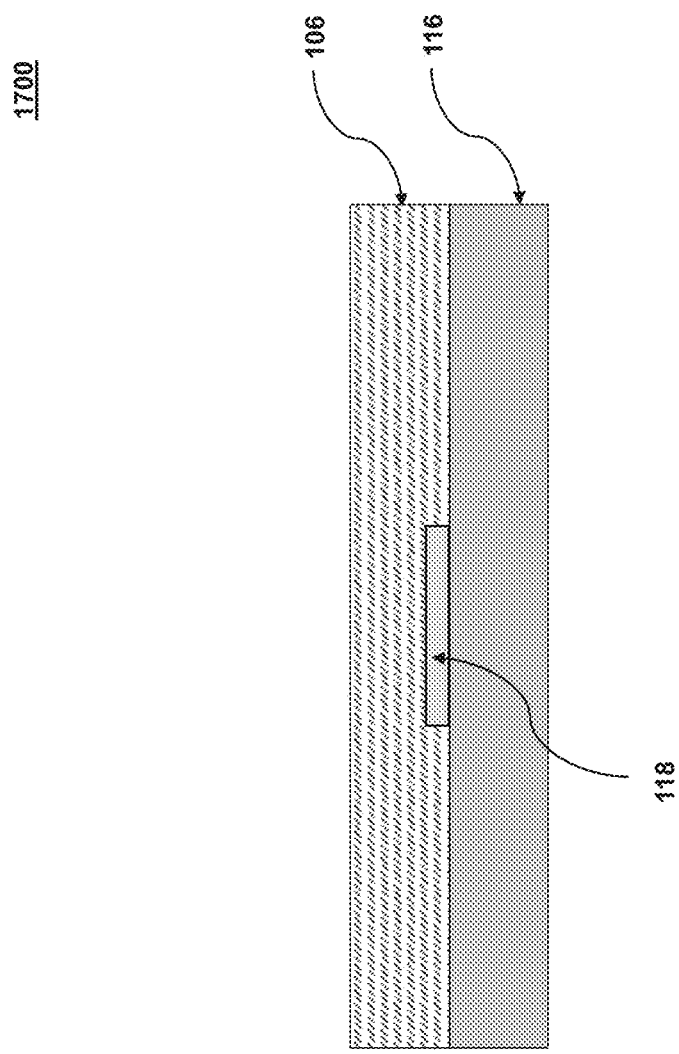
FIG. 17 is a vertical cross-sectional view of a further intermediate structure after forming an active layer over the intermediate structure of FIG. 16, according to various embodiments.

FIG. 17 is a vertical cross-sectional view of a further intermediate structure 1700 after forming an active layer 106 over the intermediate structure 1600 of FIG. 16, according to various embodiments. The active layer 106 may include materials similar to those of active layers 106 described above with reference to FIGS. 3, 7, and 12 and may be manufactured using similar processes.

Figure 18:
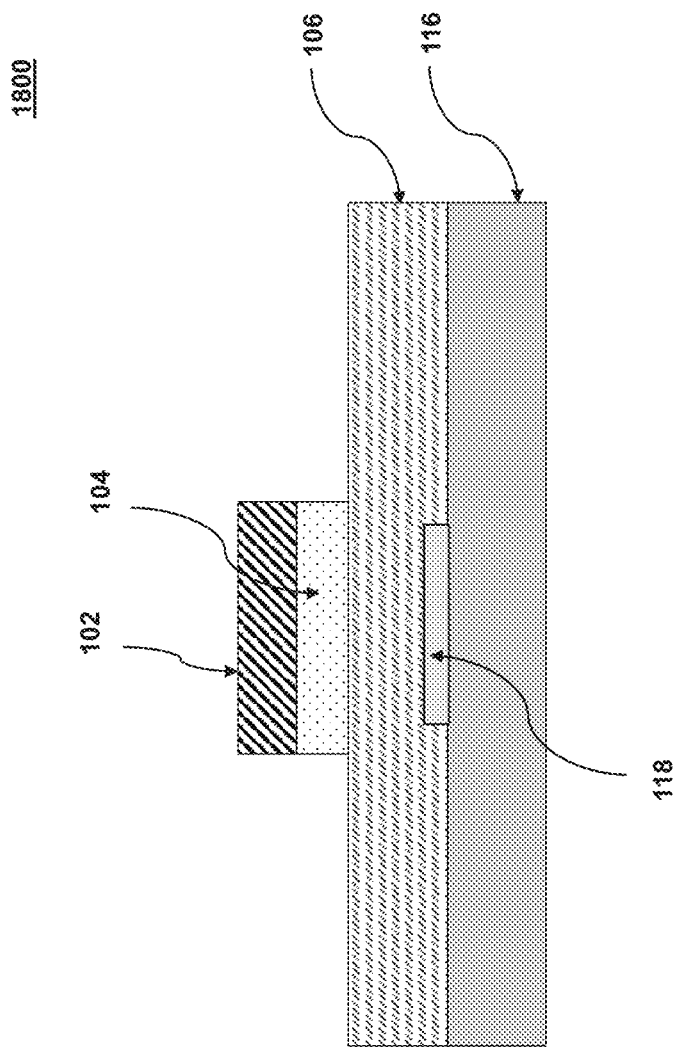
FIG. 18 is a vertical cross-sectional view of a further intermediate structure after forming an insulating layer and a gate electrode over the intermediate structure of FIG. 17, according to various embodiments.

FIG. 18 is a vertical cross-sectional view of a further intermediate structure 1800 after forming an insulating layer 104 and a gate electrode 102 over the intermediate structure 1700 of FIG. 17, according to various embodiments. The insulating layer 104 and a gate electrode 102 may be formed by depositing a layer of insulating material (not shown) and a layer of gate metal material (not shown) and then patterning the resulting structure using a patterned photoresist (not shown) to form the insulating layer 104 and gate electrode 102. After the insulating layer 104 and a gate electrode 102 are formed, the photoresist may be removed, for example, by ashing.

The insulating layer 104 may include, but is not limited to, silicon dioxide, silicon nitride, silicon oxynitride, hafnium oxide, hafnium silicon oxide, hafnium tantalum oxide, hafnium titanium oxide, hafnium zirconium oxide, zirconium oxide, titanium oxide, aluminum oxide, hafnium dioxide-alumina, or various other insulating structures such as a multi-layer stack structure including alternating insulating layers. The insulating layer 104 may be formed by any suitable technique as ALD, CVD, PECVD, PVD, etc.

The gate electrode 102 may include a gate metal material including, but not limited to, one or more of Mo, Ti/Al/Ti, TiN/W, TaN, and various other metallic alloys. In further embodiments, the gate electrode 102 may include, but is not limited to, any suitable metal, such as copper, aluminum, zirconium, titanium, tungsten, tantalum, ruthenium, palladium, platinum, cobalt, nickel, or alloys thereof. Other suitable materials are within the contemplated scope of disclosure. The gate electrode 102 may be formed by deposition of a gate metal material using any suitable technique, such as chemical vapor deposition (CVD), plasma enhanced chemical vapor deposition (PECVD), atomic layer deposition (ALD), physical vapor deposition (PVD), etc., followed by a planarization process, for example, by chemical mechanical planarization (CMP).

Figure 19:
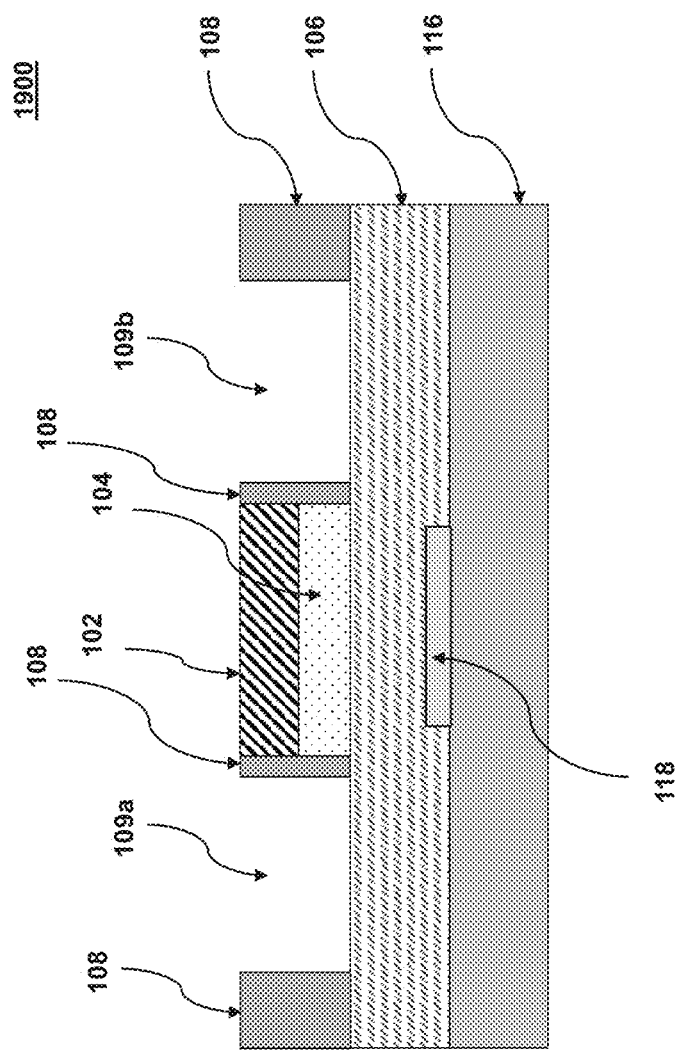
FIG. 19 is a vertical cross-sectional view of a further intermediate structure after formation of a patterned inter-layer dielectric layer over the intermediate structure of FIG. 18, according to various embodiments.

FIG. 19 is a vertical cross-sectional view of a further intermediate structure 1900 after formation of a patterned inter-layer dielectric layer 108 over the intermediate structure 1800 of FIG. 18, according to various embodiments. The inter-layer dielectric layer 108 may include materials similar to those of inter-layer dielectric layer 108 described above with reference to FIGS. 4, 9, and 13 and may be manufactured using similar processes. After deposition, the inter-layer dielectric layer 108 may be planarized (e.g., using CMP) and then patterned to form a first via cavity 109a and a second via cavity 109b. In this regard a photoresist (not shown) may be deposited over the inter-layer dielectric layer 108 and may be patterned using photolithographic techniques. The patterned photoresist may then be used to etch unmasked regions of the inter-layer dielectric layer 108 to thereby form the first via cavity 109a and the second via cavity 109b. After the first via cavity 109a and the second via cavity 109b are formed, the photoresist may be removed, for example, by ashing.

Figure 20:
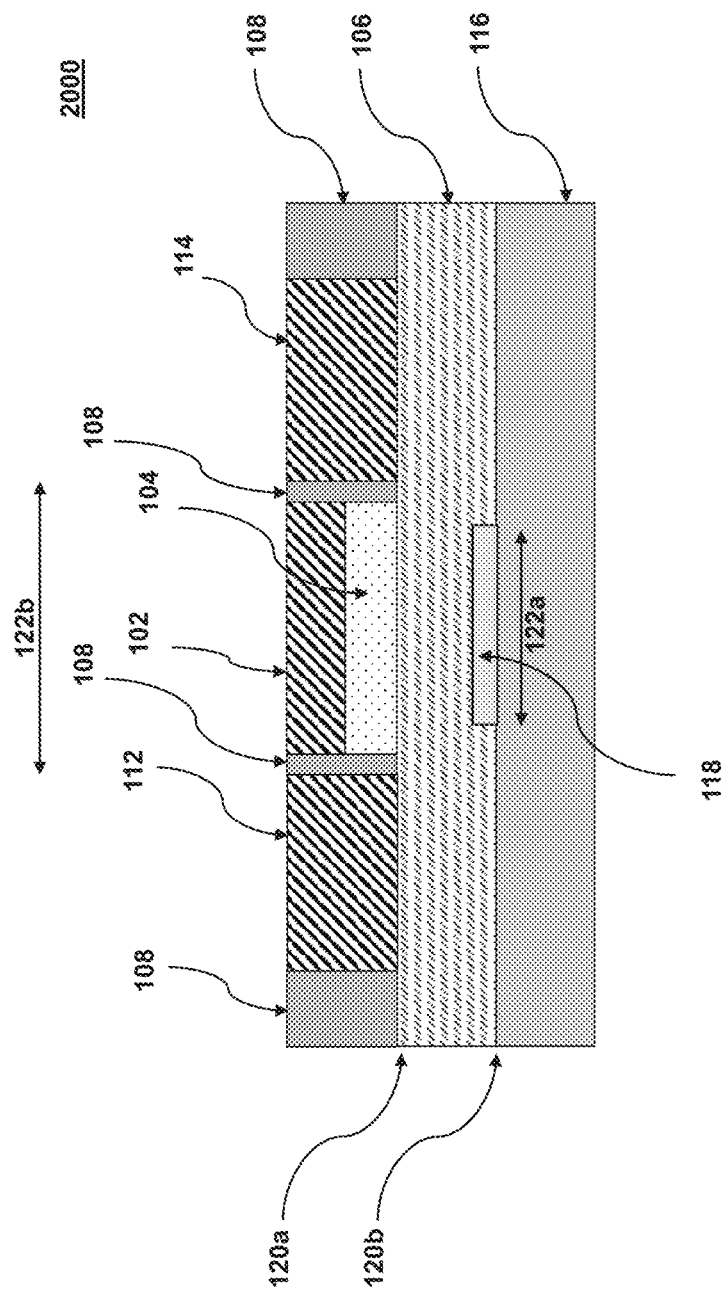
FIG. 20 is a vertical cross-sectional view of an embodiment transistor structure after formation of a source electrode and a drain electrode in via cavities of the intermediate structure of FIG. 19, according to various embodiments.

FIG. 20 is a vertical cross-sectional view of an embodiment transistor structure 2000 (e.g., front gate TFT) after formation of a source electrode 112 and a drain electrode 114 in the first via cavity 109a and the second via cavity 109b, respectively, of the intermediate structure 1900 of FIG. 19, according to various embodiments. The source electrode 112 and the drain electrode 114 may include materials similar to those of source electrodes 112 and the drain electrodes 114 described above with reference to FIGS. 5, 10, and 15 and may be manufactured using similar processes.

As shown in FIG. 20, the active layer 106 may have a top surface 120a, which is proximal to the source electrode 112 and the drain electrode 114, and a bottom surface 120b, which is distal to the source electrode 112 and the drain electrode 114. The source electrode 112 and the drain electrode 114 are each disposed on the top surface 120a of the active layer 106, and the gate electrode 102 is disposed closer to the top surface 120a of the active layer 106 than to the bottom surface 120b of the active layer 106 such that the TFT structure 2000 is configured as a front gate structure. Also, as shown in FIG. 20, the capping layer 118 may be configured to be in contact with the active layer 106. In this example, the capping layer 118 is in contact with the bottom surface 120b of the active layer 106. In other embodiments, the capping layer 118 may be disposed on the top surface 120a of the active layer 106, as described in greater detail below with reference to FIGS. 21 to 24.

The capping layer 118 (e.g., see FIG. 20) may be positioned symmetrically relative to the source electrode 112 and the drain electrode 114. Further, the width 122a of the capping layer may be chosen to be smaller than a distance 122b between the source electrode 112 and the drain electrode 114. The capping layer 118 may have a first value of electronegativity and the insulating layer 104 may have a second value of electronegativity. The material used to form the capping layer 118 and insulating layer 104 may each be chosen such that the first value of electronegativity is less than the second value of electronegativity. As such, the presence of the capping layer 118 may act to increase a carrier concentration within the active layer 106 relative to a carrier concentration that would exist in the active layer 106 in the absence of the capping layer 118. Put another way, the capping layer 118 may the provide additional carriers to diffuse into the active layer 106 so as to increase the carrier concentration within the active layer 106 in the regions of the active layer 106 surrounding the capping layer 118. In this way, carrier concentration gradients between the channel region and the source and drain regions of the active layer may be reduced.

The capping layer 118 may have various thicknesses based on the material chosen for the capping layer 118. For example, in embodiments in which the capping layer may include an oxide material, the capping layer may have a thickness in a range from 0.1 nm to 1 nm, from 0.5 nm to 2 nm, from 1 nm to 3 nm, or from 2 nm to 10 nm. In embodiments in which the capping layer 118 may include a metal, the capping layer may have a thickness in a range from 1 nm to 20 nm, from 10 nm to 50 nm, or from 30 nm to 100 nm, 50 nm to 150 nm, 100 nm to 200 nm, 150 nm to 300 nm, or 200 nm to 500 nm. The thickness of the capping layer 118 may be chosen to optimize the diffusion of carriers into the active layer 106.

Figure 21:
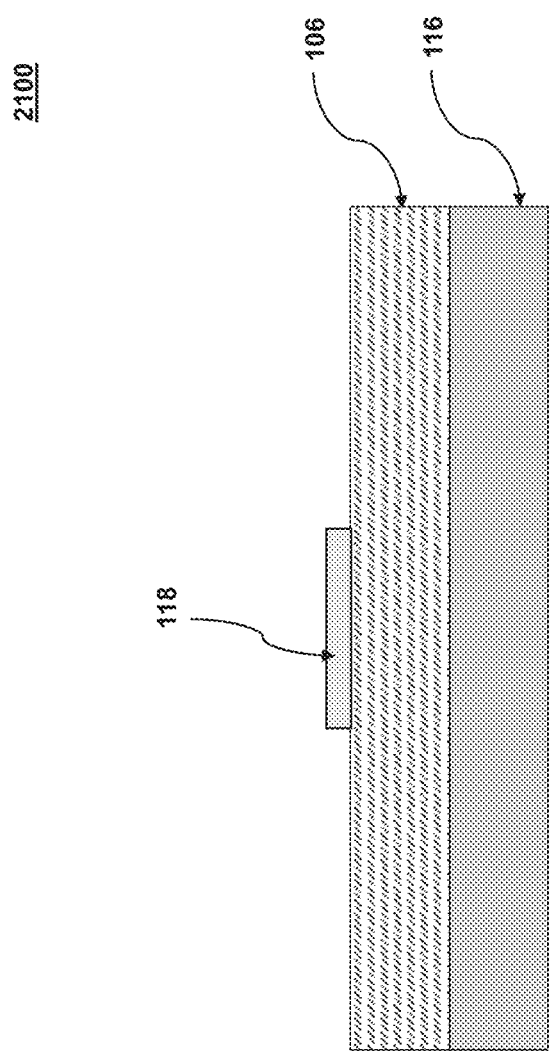
FIG. 21 is a vertical cross-sectional view of an intermediate structure used in the construction of a further transistor structure having reduced short channel effects, according to various embodiments.

FIG. 21 is a vertical cross-sectional view of an intermediate structure 2100 used in the construction of a further embodiment transistor structure (e.g., front gate TFT) having reduced short channel effects, according to various embodiments. In this regard, the intermediate structure 2100 includes a buffer layer 116 and an active layer 106 formed over the buffer layer 116. The intermediate structure 2100 may further include a capping layer 118 formed over the active layer 106. The buffer layer 116 may include materials similar to those of buffer layer 116 described above with reference to FIG. 16 and may be manufactured using similar processes. The active layer 106 may include materials similar to those of active layers 106 described above with reference to FIGS. 3, 7, 12, and 17 and may be manufactured using similar processes. The capping layer 118 may include materials similar to those of capping layers 118 described above with reference to FIGS. 2, 8, and 16 and may be manufactured using similar processes.

Figure 22:
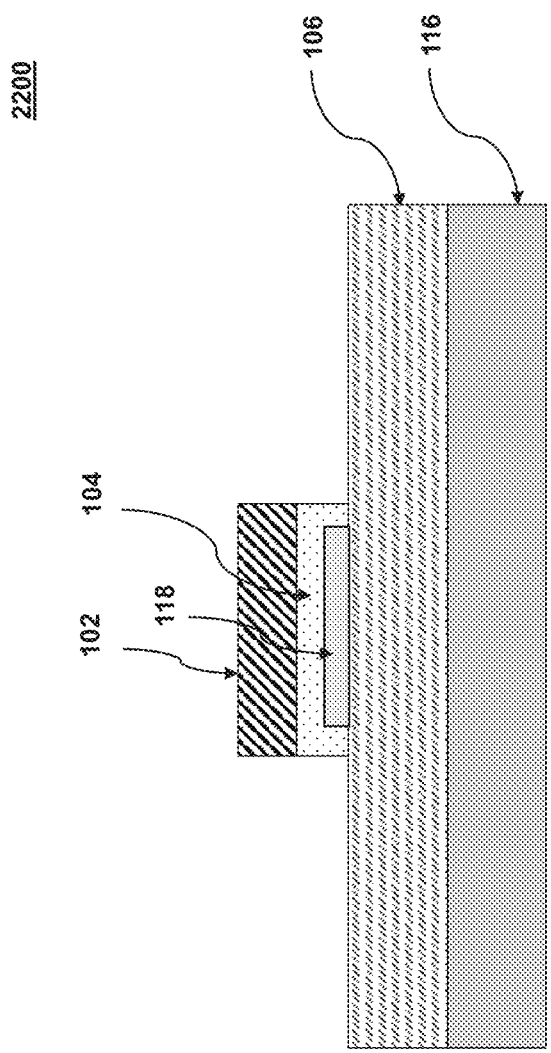
FIG. 22 is a vertical cross-sectional view of a further intermediate structure after forming an insulating layer and a gate electrode over the intermediate structure of FIG. 21, according to various embodiments.

FIG. 22 is a vertical cross-sectional view of a further intermediate structure 2200 after formation of an insulating layer 104 and a gate electrode 102 over the intermediate structure 2100 of FIG. 21, according to various embodiments. The insulating layer 104 and the gate electrode 102 may include materials similar to those of insulating layer 104 and the gate electrode 102 described above with reference to FIG. 18 and may be manufactured using similar processes.

Figure 23:
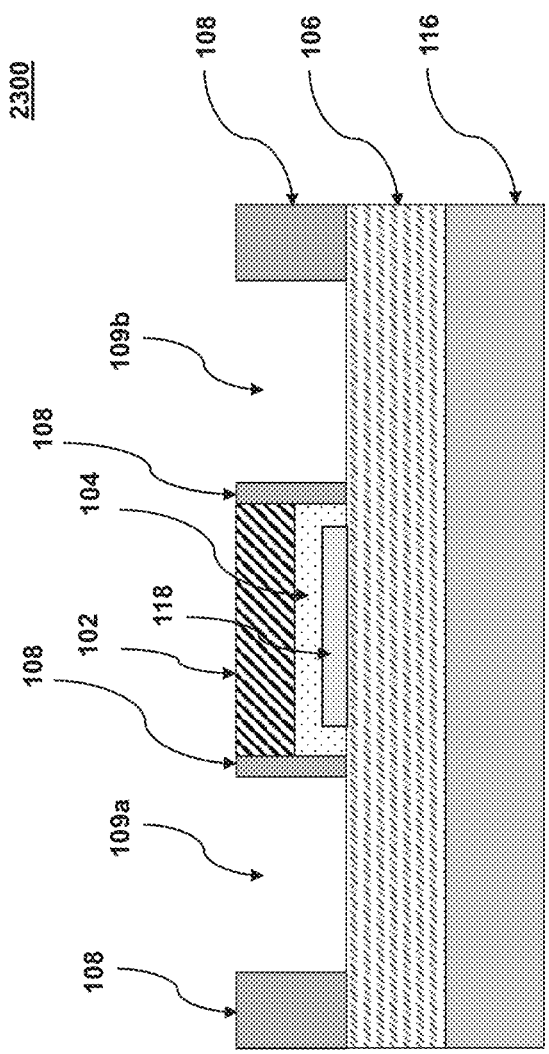
FIG. 23 is a vertical cross-sectional view of a further intermediate structure after formation of a patterned inter-layer dielectric layer over the intermediate structure of FIG. 22, according to various embodiments.

FIG. 23 is a vertical cross-sectional view of a further intermediate structure 2300 after formation of a patterned inter-layer dielectric layer 108 over the intermediate structure of FIG. 22, according to various embodiments. The inter-layer dielectric layer 108 may include materials similar to those of inter-layer dielectric layer 108 described above with reference to FIGS. 4, 9, 13, and 19 and may be manufactured using similar processes. After deposition, the inter-layer dielectric layer 108 may be planarized (e.g., using CMP) and then patterned to form a first via cavity 109a and a second via cavity 109b. In this regard a photoresist (not shown) may be deposited over the inter-layer dielectric layer 108 and may be patterned using photolithographic techniques. The patterned photoresist may then be used to etch unmasked regions of the inter-layer dielectric layer 108 to thereby form the first via cavity 109a and the second via cavity 109b.

Figure 24:
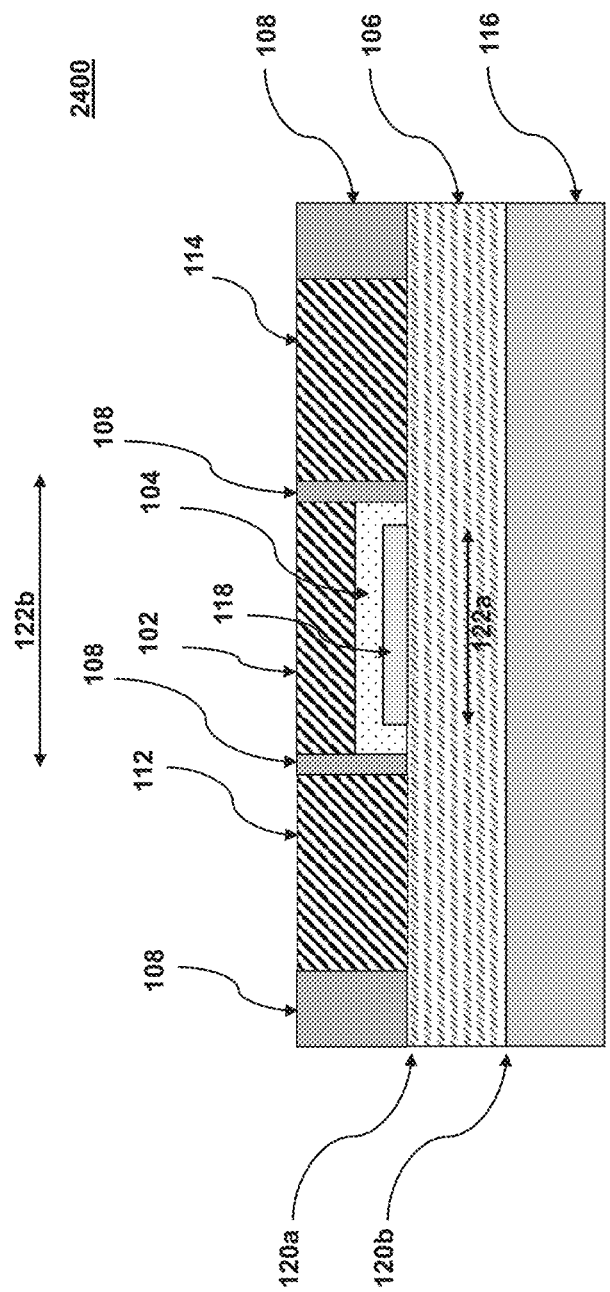
FIG. 24 is a vertical cross-sectional view of an embodiment transistor structure after formation of a source electrode and a drain electrode in via cavities of the intermediate structure of FIG. 23, according to various embodiments.

FIG. 24 is a vertical cross-sectional view of an embodiment front gate TFT structure 2400 after formation of a source electrode 112 and a drain electrode 114 in the first via cavity 109a and the second via cavity 109b of the intermediate structure 2300 of FIG. 23, according to various embodiments. The source electrode 112 and the drain electrode 114 may include materials similar to those of source electrodes 112 and the drain electrodes 114 described above with reference to FIGS. 5, 10, 15, and 20 and may be manufactured using similar processes.

As shown in FIG. 24, the active layer 106 has a top surface 120a, which is proximal to the source electrode 112 and the drain electrode 114, and a bottom surface 120b, which is distal to the source electrode 112 and the drain electrode 114. The source electrode 112 and the drain electrode 114 are each disposed on the top surface 120a of the active layer 106, and the gate electrode 102 is disposed closer to the top surface 120a of the active layer 106 than to the bottom surface 120b of the active layer 106 such that the TFT structure 2400 is configured as a front gate structure. Also, as shown in FIG. 24, the capping layer 118 may be configured to be in contact with the active layer 106. In this example, the capping layer 118 is in contact with the top surface 120a of the active layer 106. In other embodiments, the capping layer 118 may be disposed on the top surface 120a of the active layer 106, as described in above with reference to FIGS. 16 to 20.

The capping layer 118 (e.g., see FIG. 24) may be positioned symmetrically relative to the source electrode 112 and the drain electrode 114. Further, the width 122a of the capping layer 118 may be chosen to be smaller than a distance 122b between the source electrode 112 and the drain electrode 114. The capping layer 118 may have a first value of electronegativity and the insulating layer 104 may have a second value of electronegativity. The material used to form the capping layer 118 and insulating layer 104 may each be chosen such that the first value of electronegativity is less than the second value of electronegativity. As such, the presence of the capping layer 118 may act to increase a carrier concentration within the active layer 106 relative to a carrier concentration that would exist in the active layer 106 in the absence of the capping layer 118. Put another way, the capping layer 118 may the provide additional carriers to diffuse into the active layer 106 so as to increase the carrier concentration within the active layer 106 in the regions of the active layer 106 surrounding the capping layer 118. In this way, carrier concentration gradients between the channel region and the source and drain regions of the active layer may be reduced.

The capping layer 118 may have various thicknesses based on the material chosen for the capping layer 118. For example, in embodiments in which the capping layer includes an oxide material, the capping layer may have a thickness in a range from 0.1 nm to 1 nm, from 0.5 nm to 2 nm, from 1 nm to 3 nm, or from 2 nm to 10 nm. In embodiments in which the capping layer 118 includes a metal, the capping layer may have a thickness in a range from 1 nm to 20 nm, from 10 nm to 50 nm, or from 30 nm to 100 nm, 50 nm to 150 nm, 100 nm to 200 nm, 150 nm to 300 nm, or 200 nm to 500 nm The thickness of the capping layer 118 may be chosen to optimize the diffusion of carriers into the active layer 106.

Figure 25:
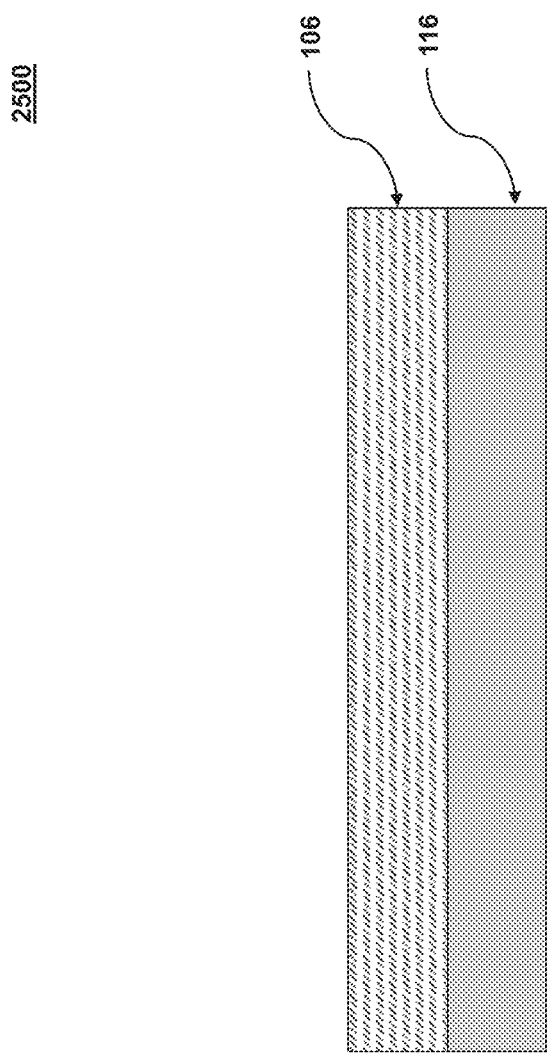
FIG. 25 is a vertical cross-sectional view of an intermediate structure used in the construction of a further transistor structure having reduced short channel effects, according to various embodiments.

FIG. 25 is a vertical cross-sectional view of an intermediate structure 2500 used in the construction of another transistor structure (e.g., front gate TFT) having reduced short channel effects, according to various embodiments. In this regard, the intermediate structure 2500 includes a buffer layer 116 and an active layer 106 formed over the buffer layer 116. The buffer layer 116 may include materials similar to those of buffer layer 116 described above with reference to FIGS. 16 and 21 and may be manufactured using similar processes. The active layer 106 may include materials similar to those of active layers 106 described above with reference to FIGS. 3, 7, 12, 17, and 21 and may be manufactured using similar processes.

Figure 26:
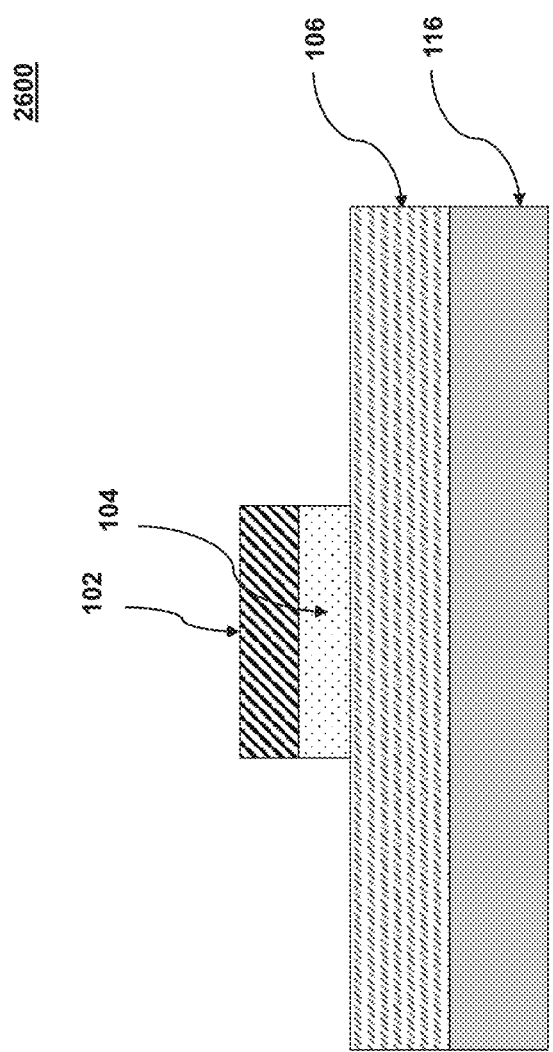
FIG. 26 is a vertical cross-sectional view of a further intermediate structure after forming an insulating layer and a gate electrode over the intermediate structure of FIG. 25, according to various embodiments.

FIG. 26 is a vertical cross-sectional view of a further intermediate structure 2600 after forming an insulating layer 104 and a gate electrode 102 over the intermediate structure 2500 of FIG. 25, according to various embodiments. The insulating layer 104 and the gate electrode 102 may include materials similar to those of insulating layer 104 and the gate electrode 102 described above with reference to FIGS. 18 and 22 and may be manufactured using similar processes.

Figure 27:
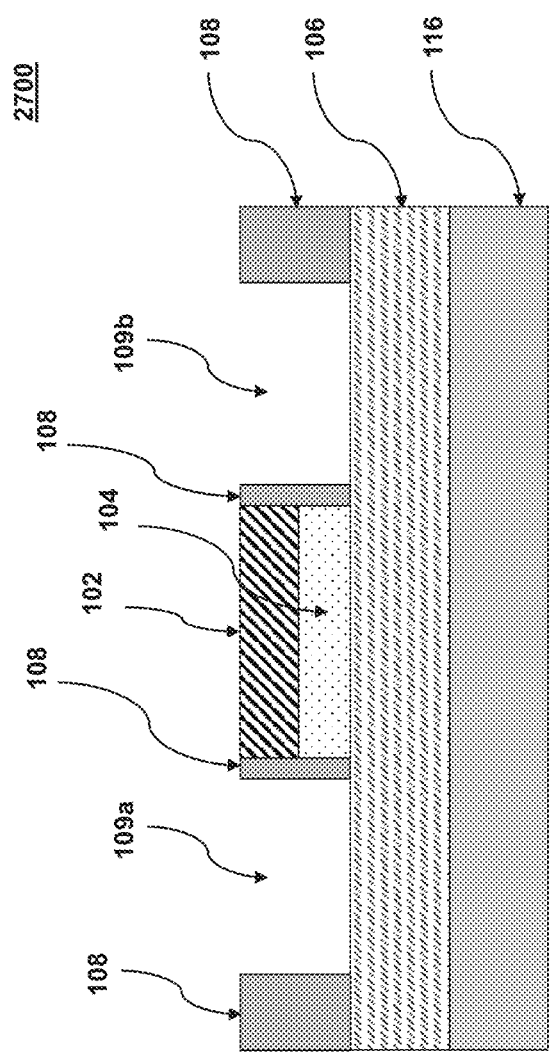
FIG. 27 is a vertical cross-sectional view of a further intermediate structure after formation of a patterned interlayer dielectric layer over the intermediate structure of FIG. 26, according to various embodiments.

FIG. 27 is a vertical cross-sectional view of a further intermediate structure 2700 after formation of a patterned inter-layer dielectric layer 108 over the intermediate structure 2600 of FIG. 26, according to various embodiments. The inter-layer dielectric layer 108 may include materials similar to those of inter-layer dielectric layer 108 described above with reference to FIGS. 4, 9, 13, 19, and 23 and may be manufactured using similar processes. After deposition, the inter-layer dielectric layer 108 may be planarized (e.g., using CMP) and then patterned to form a first via cavity 109a and a second via cavity 109b. In this regard a photoresist (not shown) may be deposited over the inter-layer dielectric layer 108 and may be patterned using photolithographic techniques. The patterned photoresist may then be used to etch unmasked regions of the inter-layer dielectric layer 108 to thereby form the first via cavity 109a and the second via cavity 109b.

Figure 28:
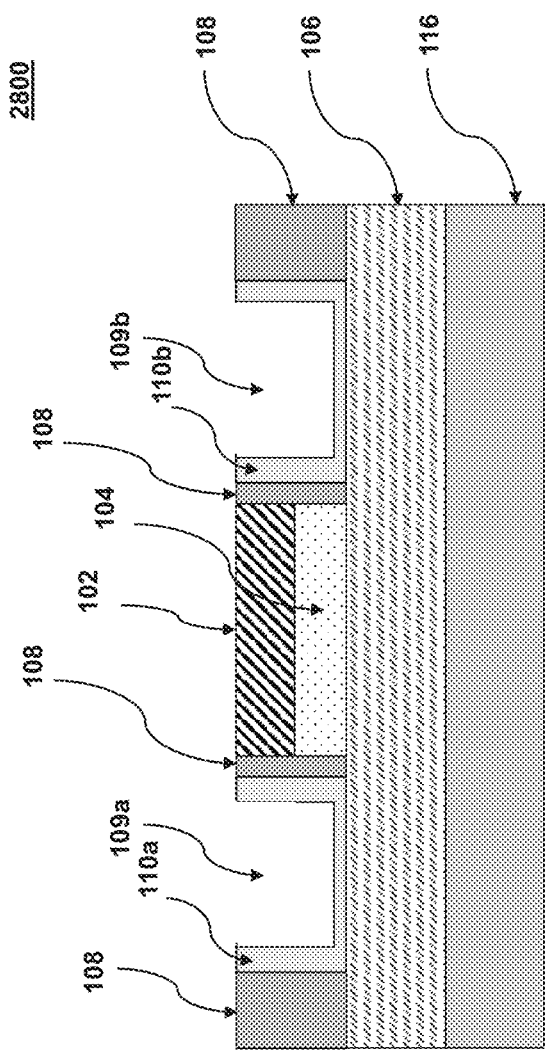
FIG. 28 is a vertical cross-sectional view of a further intermediate structure after formation of a first injection layer and a second injection layer in via cavities of the intermediate structure of FIG. 27, according to various embodiments.

FIG. 28 is a vertical cross-sectional view of a further intermediate structure 2800 after formation of a first injection layer 110a a and a second injection layer 110b in the first via cavity 109a and the second via cavity 109b of the intermediate structure 2700 of FIG. 27, according to various embodiments. The first injection layer 110a and a second injection layer 110b may include materials similar to those of the first injection layer 110a and a second injection layer 110b described above with reference to FIG. 14 and may be manufactured using similar processes. The first injection layer 110a and the second injection layer 110b may be chosen to have various thicknesses depending on the material used to form the first injection layer 110a and the second injection layer 110b. For example, the first injection layer 110a and the second injection layer 110b may each include an oxide material having a thickness in a range from 0.1 nm to 1 nm, from 0.5 nm to 2 nm, from 1 nm to 3 nm, or from 2 nm to 10 nm. Alternatively, the first injection layer 110a and the second injection layer 110b may each include a metal or a nitride material and have a thickness in a range from 1 nm to 20 nm, from 3 nm to 12 nm, or from 5 nm to 10 nm.

Figure 29:
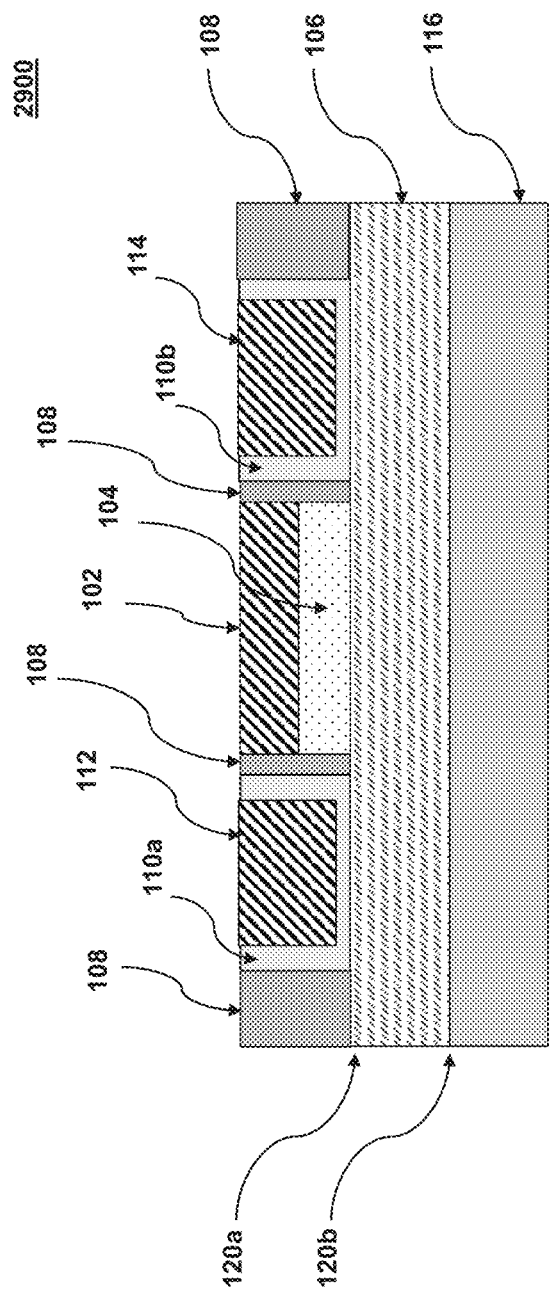
FIG. 29 is a vertical cross-sectional view of an embodiment transistor structure after formation of a source electrode and a drain electrode over the first injection layer and the second injection layer, respectively, of the intermediate structure of FIG. 28, according to various embodiments.

FIG. 29 is a vertical cross-sectional view of an embodiment front gate TFT structure 2900 after formation of a source electrode 112 and a drain electrode 114 over the first injection layer 110a and the second injection layer 110b, respectively, of the intermediate structure 2800 of FIG. 28, according to various embodiments. The source electrode 112 and the drain electrode 114 may include materials similar to those of source electrodes 112 and the drain electrodes 114 described above with reference to FIGS. 5, 10, 15, 20, and 24 and may be manufactured using similar processes.

In further embodiments, the first injection layer 110a and the second injection layer 110b each include a material having a first value of electronegativity and the source electrode 112 and the drain electrode 114 may each have a second value of electronegativity. The material forming the first injection layer 110a and the second injection layer 110b may be chosen such that the first value of electronegativity (i.e., the electronegativity of the first injection layer 110a and the second injection layer 110b) is greater than the second value of electronegativity (i.e., the electronegativity of the source electrode 112 and the drain electrode 114). As such, first injection layer 110a and the second injection layer 110b act to reduce a carrier concentration within the active layer 106 respectively near the source electrode 112 and near the drain electrode 114 relative to corresponding carrier concentrations that would exist in the active layer 106 if the source electrode 112 and the drain electrode 114 were in direct contact with the active layer 106, without the presence of the first injection layer 110a and the second injection layer 110b. In this way, carrier concentration gradients between the channel region and the source and drain regions of the active layer may be reduced.

As shown in FIG. 29, the active layer 106 has a top surface 120a, which is proximal to the source electrode 112 and the drain electrode 114, and a bottom surface 120b, which is distal to the source electrode 112 and the drain electrode 114. The source electrode 112 and the drain electrode 114 are each disposed on the top surface 120a of the active layer 106, and the gate electrode 102 is disposed closer to the top surface 120a of the active layer 106 than to the bottom surface 120b of the active layer 106 such that the TFT structure 2900 is configured as a front gate structure.

Figure 30:
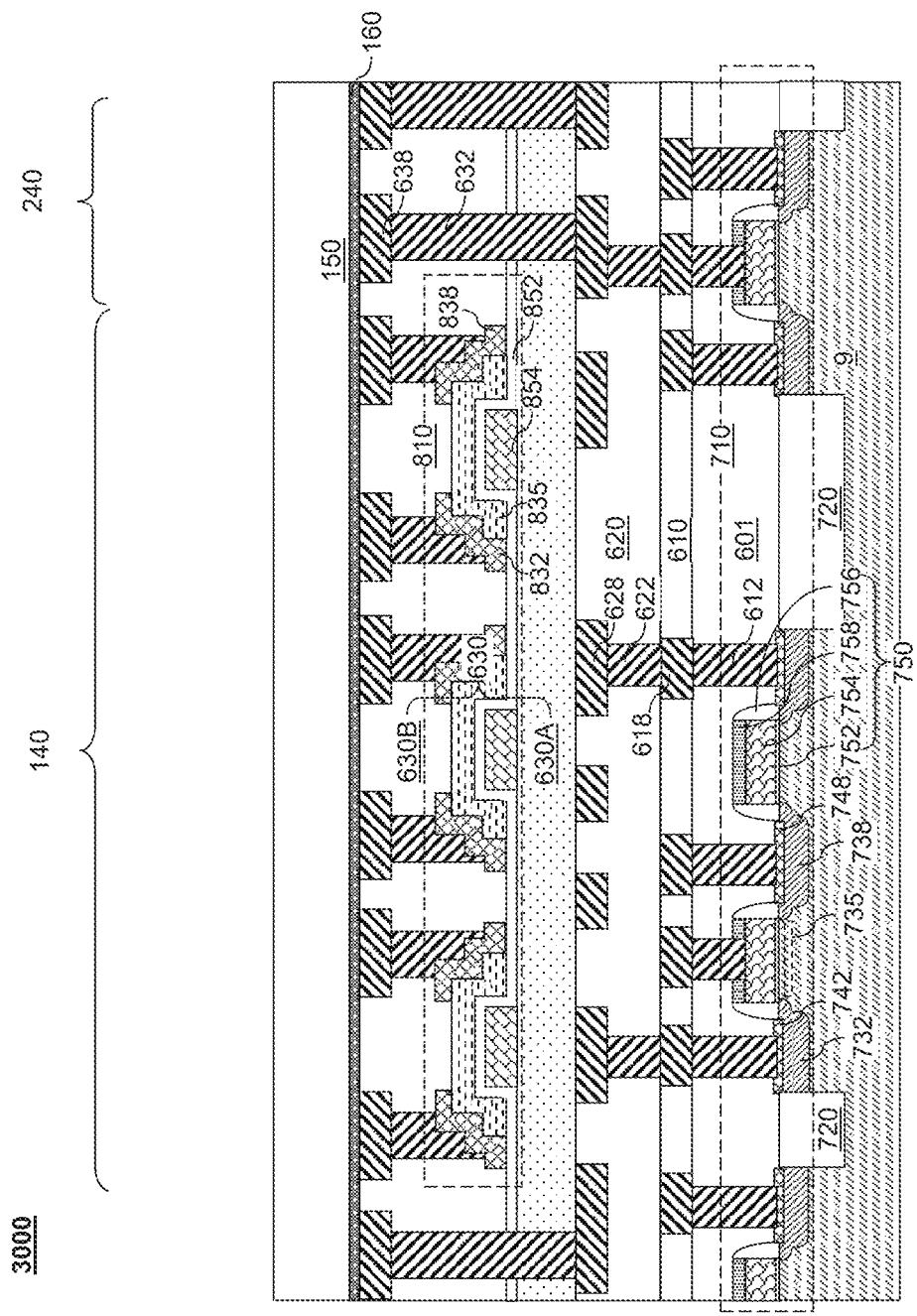
FIG. 30 is a vertical cross-sectional view of an exemplary structure after formation of complementary metal-oxide-semiconductor (CMOS) transistors, metal interconnect structures formed in dielectric material layers, and thin film transistors (TFTs), according to various embodiments.

FIG. 30 is a vertical cross-sectional view of an exemplary structure 3000 after formation of complementary metal-oxide-semiconductor (CMOS) transistors, metal interconnect structures formed in dielectric material layers, and thin film transistors (TFTs) according to an embodiment of the present disclosure. The exemplary structure includes a substrate 9, which may be a semiconductor substrate such as a commercially available silicon substrate. Shallow trench isolation structures 720 including a dielectric material such as silicon oxide may be formed in an upper portion of the substrate 9. Suitable doped semiconductor wells, such as p-type wells and n-type wells, may be formed within each area that is laterally enclosed by a portion of the shallow trench isolation structures 720. Field effect transistors may be formed over the top surface of the substrate 9. For example, each field effect transistor may include a source region 732, a drain region 738, a semiconductor channel 735 that includes a surface portion of the substrate 9 extending between the source region 732 and the drain region 738, and a gate structure 750. The semiconductor channel 735 may include a single crystalline semiconductor material. Each gate structure 750 may include a gate dielectric 752, a gate electrode 754, a gate cap dielectric 758, and a dielectric gate spacer 756. A source-side metal-semiconductor alloy region 742 may be formed on each source region 732, and a drain-side metal-semiconductor alloy region 748 may be formed on each drain region 738.

The exemplary structure may include a memory array region 140 in which an array of memory elements may be subsequently formed, and a peripheral region 240 in which logic devices that support operation of the array of memory elements may be formed. In one embodiment, devices (such as field effect transistors) in the memory array region 140 may include bottom electrode access transistors that provide access to bottom electrodes of memory cells to be subsequently formed. Top electrode access transistors that provide access to top electrodes of memory cells to be subsequently formed may be formed in the peripheral region 240 at this processing step. Generally, access transistors may be formed over the substrate 9 such that a source region 732 or a drain region 738 of each access transistor is electrically connected to a bottom electrode or to a top electrode of a respective memory cell by a respective set of metal interconnect structure.

Devices (such as field effect transistors) in the peripheral region 240 may provide functions that are needed to operate the array of memory cells to be subsequently formed. Specifically, devices in the peripheral region may be configured to control the programming operation, the erase operation, and the sensing (read) operation of the array of memory cells. For example, the devices in the peripheral region may include a sensing circuitry and/or a top electrode bias circuitry. The devices formed on the top surface of the substrate 9 may include complementary metal-oxide-semiconductor (CMOS) transistors and optionally additional semiconductor devices (such as resistors, diodes, capacitors, etc.), and are collectively referred to as CMOS circuitry 710. These devices may be typically formed in a front-end-of-line (FEOL).

Various metal interconnect structures formed within dielectric material layers may be subsequently formed over the substrate 9 and the semiconductor devices thereupon (such as field effect transistors). The dielectric material layers may include, for example, a contact-level dielectric material layer 601, a first metal-line-level dielectric material layer 610, a second line-and-via-level dielectric material layer 620, and a third line-and-via-level dielectric material layer 630. The metal interconnect structures may include device contact via structures 612 formed in the contact-level dielectric material layer 601 and contact a respective component of the CMOS circuitry 710, first metal line structures 618 formed in the first metal-line-level dielectric material layer 610, first metal via structures 622 formed in a lower portion of the second line-and-via-level dielectric material layer 620, second metal line structures 628 formed in an upper portion of the second line-and-via-level dielectric material layer 620, second metal via structures 632 formed in a lower portion of the third line-and-via-level dielectric material layer 630, and third metal line structures 638 formed in an upper portion of the third line-and-via-level dielectric material layer 630. In one embodiment, the second metal line structures 628 may include source lines that are connected a source-side power supply for an array of memory elements. The voltage provided by the source lines may be applied to the bottom electrodes through the access transistors provided in the memory array region 140.

Each of the dielectric material layers (601, 610, 620, 630) may include a dielectric material such as undoped silicate glass, a doped silicate glass, organosilicate glass, amorphous fluorinated carbon, porous variants thereof, or combinations thereof. Other dielectric materials are within the contemplated scope of disclosure. Each of the metal interconnect structures (612, 618, 622, 628, 632, 638) may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic materials within the contemplated scope of disclosure may also be used. In one embodiment, the first metal via structures 622 and the second metal line structures 628 may be formed as integrated line and via structures by a dual damascene process, and/or the second metal via structures 632 and the third metal line structures 638 may be formed as integrated line and via structures. While the present disclosure is described using an embodiment in which an array of memory cells formed over the third line-and-via-level dielectric material layer 630, embodiments are expressly contemplated herein in which the array of memory cells may be formed at a different metal interconnect level.

In one embodiment, a transistor, such as a thin film transistors (TFTs) 810, may be formed in one of the metal interconnect levels. For example, the TFTs 810 may be formed within the second line-and-via-level dielectric material layer 620 or within the third line-and-via-level dielectric material layer 630. In an illustrative example, the TFTs 810 may be formed within the third line-and-via-level dielectric material layer 630. In this embodiment, the third line-and-via-level dielectric material layer 630 may include a lower dielectric material layer 630A that may be formed over the second line-and-via-level dielectric material layer prior to formation of the TFTs, and an upper dielectric material layer 630B that may be formed over the TFTs. Each TFT may include a respective TFT gate electrode 854, a respective TFT gate dielectric that may be a portion of a continuous TFT gate dielectric layer 852 that overlies the TFT gate electrode 854, a respective TFT channel 835 that overlies the respective TFT gate electrode 854, a respective TFT source region 832 that contacts a top surface of a first end of the respective TFT channel 835, and a respective TFT drain region 838 that contacts a top surface of a second end of the respective TFT channel 835. A subset of the second metal via structures 632 may contact a respective one of the TFT gate electrodes 854, the TFT source regions 832, and the TFT drain regions 838. The TFT transistors 810 may function as access transistors that control access to the bottom electrodes or top electrodes of memory cells to be subsequently formed above. While the present disclosure is described using a specific configuration for the TFT gate electrodes 854, the TFT source regions 832, and the TFT drain regions 838, alternative configurations for the TFT gate electrodes 854, the TFT source regions 832, and the TFT drain regions 838 may also be used. For example, each of the TFT gate electrodes 854, the TFT source regions 832, and the TFT drain regions 838 may be raised, recessed, or laterally shifted relative to adjacent elements. In further embodiments, TFT transistors may include various embodiment transistor structures described above with reference to FIGS. 5, 10, 15, 20, 24, and 29.

A dielectric cap layer 160 and a connection-via-level dielectric layer 150 may be sequentially formed over the metal interconnect structures and the dielectric material layers. For example, the dielectric cap layer 160 may be formed on the top surfaces of the third metal line structures 638 and on the top surface of the third line-and-via-level dielectric material layer 630. The dielectric cap layer 160 includes a dielectric capping material that may protect underlying metal interconnect structures such as the third metal line structures 638. In one embodiment, the dielectric cap layer 160 may include a material that may provide high etch resistance, i.e., a dielectric material and also may function as an etch stop material during a subsequent anisotropic etch process that etches the connection-via-level dielectric layer 150. For example, the dielectric cap layer 160 may include silicon carbide or silicon nitride, and may have a thickness in a range from 5 nm to 30 nm, although lesser and greater thicknesses may also be used.

The connection-via-level dielectric layer 150 may include any material that may be used for the dielectric material layers (601, 610, 620, 630). For example, the connection-via-level dielectric layer 150 may include undoped silicate glass or a doped silicate glass deposited by decomposition of tetraethylorthosilicate (TEOS). The thickness of the connection-via-level dielectric layer 150 may be in a range from 50 nm to 200 nm, although lesser and greater thicknesses may also be used. The dielectric cap layer 160 and the connection-via-level dielectric layer 150 may be formed as planar blanket (unpatterned) layers having a respective planar top surface and a respective planar bottom surface that extends throughout the memory array region 140 and the peripheral region 240.

Figure 31:
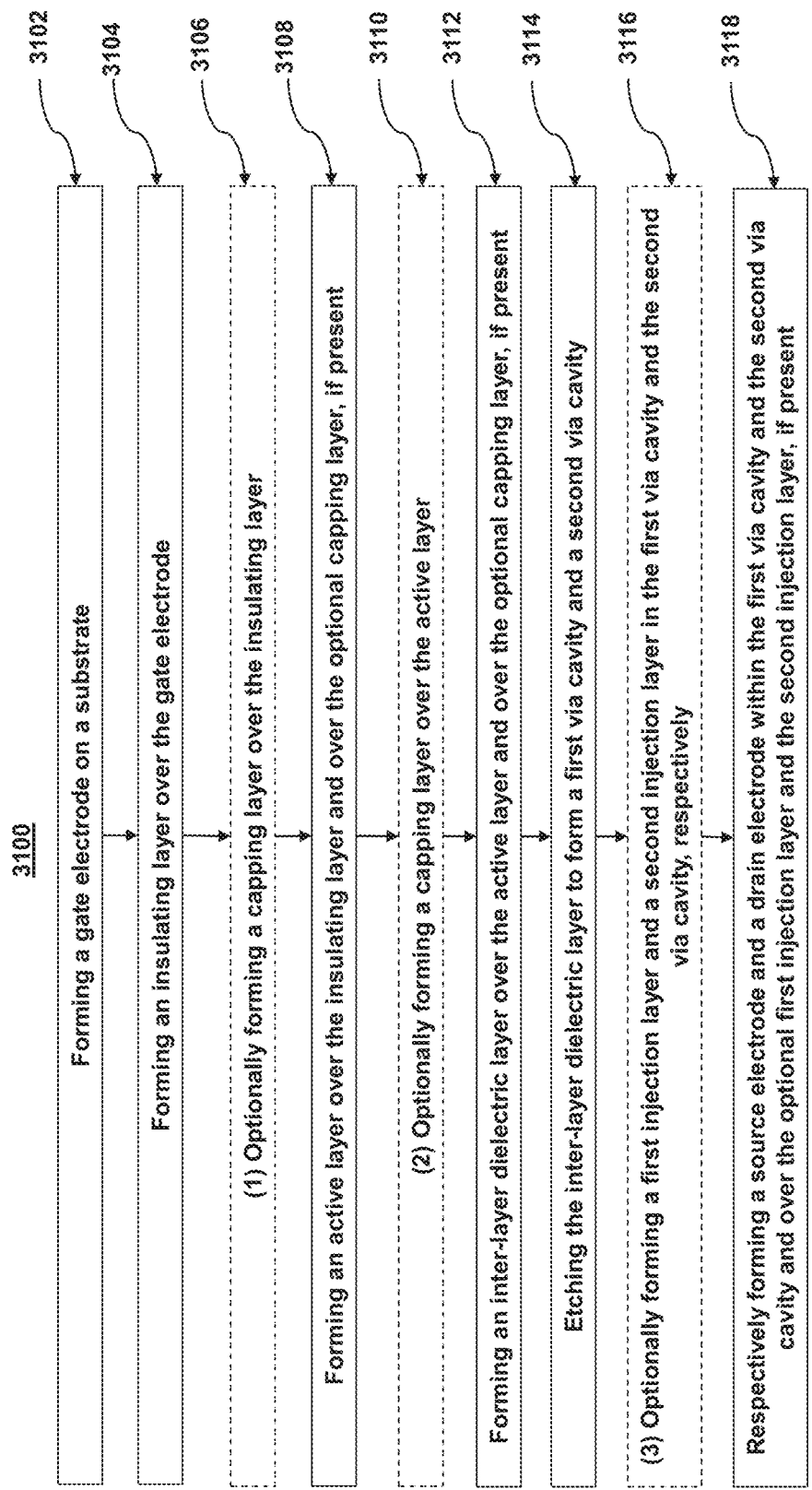
FIG. 31 is a flowchart illustrating stages of a method of manufacturing an embodiment transistor structure, according to various embodiments.

FIG. 31 is a flowchart illustrating operations of a method 3100 of manufacturing an embodiment transistor structure (e.g., back gate TFT), according to various embodiments. In operation 3102, the method 3100 may include forming a gate electrode 102 on a substrate (e.g., see FIGS. 1, 6, and 11). In operation 3104, the method 3100 may include forming an insulating layer 104 over the gate electrode 102 (e.g., see FIGS. 1, 6, and 11). In operation 3106, the method 3100 may include (1) optionally forming a carrier modification device in the form of a capping layer 118 over the insulating layer 104, as described above with reference to FIG. 2. In operation 3108, the method 3100 may include forming an active layer 106 over the insulating layer 104 (e.g., see FIGS. 3, 7, and 12) and over the optional capping layer 118 (e.g., see FIG. 3), if present. In operation 3110, the method 3100 may include (2) optionally forming the carrier modification device in the form of a capping layer 118 over the active layer 106, as described above with reference to FIG. 8.

In operation 3112, the method 3100 may include forming an inter-layer dielectric layer 108 over the active layer 106 (e.g., see FIGS. 4, 9, and 13) and over the optional capping layer 118 (e.g., see FIG. 9), if present. In operation 3114, the method 3100 may include etching the inter-layer dielectric layer 108 to form a first via cavity 109a and a second via cavity 109b (e.g., see FIGS. 4, 9, and 13). In operation 3116, the method 3100 may include (3) optionally forming the carrier modification device in the form of a first injection layer 110a and a second injection layer 110b (e.g., see FIG. 14) in the first via cavity 109a and the second via cavity 109b, respectively. In operation 3118, the method 3100 may include respectively forming a source electrode 112 and a drain electrode 114 within the first via cavity 109a and the second via cavity 109b (e.g., see FIGS. 5, and 10) and over the optional first injection layer 110a and the second injection layer 110b (e.g., see FIG. 15), if present. In the above described method 3100, option (1) corresponds to the embodiment transistor structure 500 of FIG. 5, option (2) corresponds to the embodiment transistor structure 1000 of FIG. 10, and option (3) corresponds to the embodiment transistor structure 1500 of FIG. 15. Further embodiments may include two or more of options (1), (2), and (3). For example, certain embodiments (not shown) may include a first injection layer 110a, a second injection layer 110b, and a capping layer 118.

When operations (1) or (2) of method 3100 are performed, forming the capping layer 118 may further include conformally depositing a layer of one or more of $InO_x$, $GaO_x$, ZnO, IZO, $CaO_x$/ZnO, ZnO/$GaO_x$, Al, Mo, W, Ti, Ca, oxides thereof, and alloys thereof, and patterning the deposited layer to form the capping layer 118, as described above with reference to FIGS. 2 and 8. Forming the capping layer 118 may further include conformally depositing and patterning an oxide material having a thickness in a range from 0.1 nm to 1 nm, from 0.5 nm to 2 nm, from 1 nm to 3 nm, or from 2 nm to 10 nm; or conformally depositing and patterning a metal having a thickness in a range from 1 nm to 20 nm, from 10 nm to 50 nm, or from 30 nm to 100 nm, 50 nm to 150 nm, 100 nm to 200 nm, 150 nm to 300 nm, or 200 nm to 500 nm.

When optional operation (3) of method 3100 is performed, forming a first injection layer 110a and a second injection layer 110b in the first via cavity 109a and the second via cavity 109b, respectively may further include conformally depositing, in each of the first via cavity 109a and the second via cavity 109b, a layer of one or more of InOx, InGaZnO, InZnO, $CaO_x$, ZnO, $CaO_x$/ZnO, ZnO/$GaO_x$, TiN, TaN, Au, Pt, Ru, and alloys thereof to thereby form the first injection layer 110a and the second injection layer 110b, as described above with reference to FIG. 14. Forming a first injection layer 110a and a second injection layer 110b in the first via cavity 109a and the second via cavity 109b, respectively may further include conformally depositing, in each of the first via cavity and the second via cavity, an oxide material having a thickness in a range from 0.1 nm to 1 nm, from 0.5 nm to 2 nm, from 1 nm to 3 nm, or from 2 nm to 10 nm; or conformally depositing, in each of the first via cavity and the second via cavity, a metal or a nitride material having a thickness in a range from 1 nm to 20 nm, from 3 nm to 12 nm, or from 5 nm to 10 nm.

Figure 32:
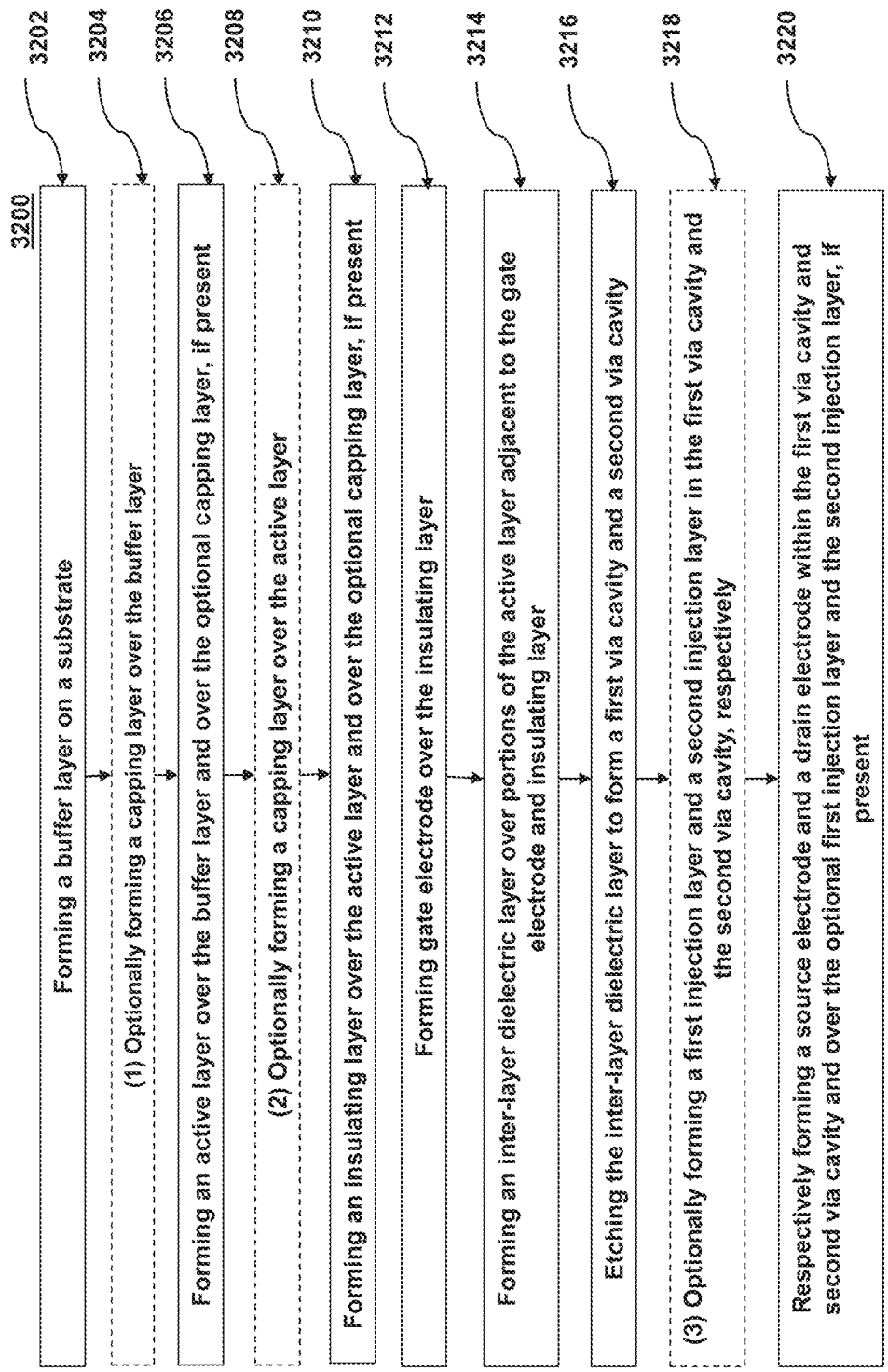
FIG. 32 is a flowchart illustrating stages of a method of manufacturing a transistor structure, according to various embodiments.
Figure 33:
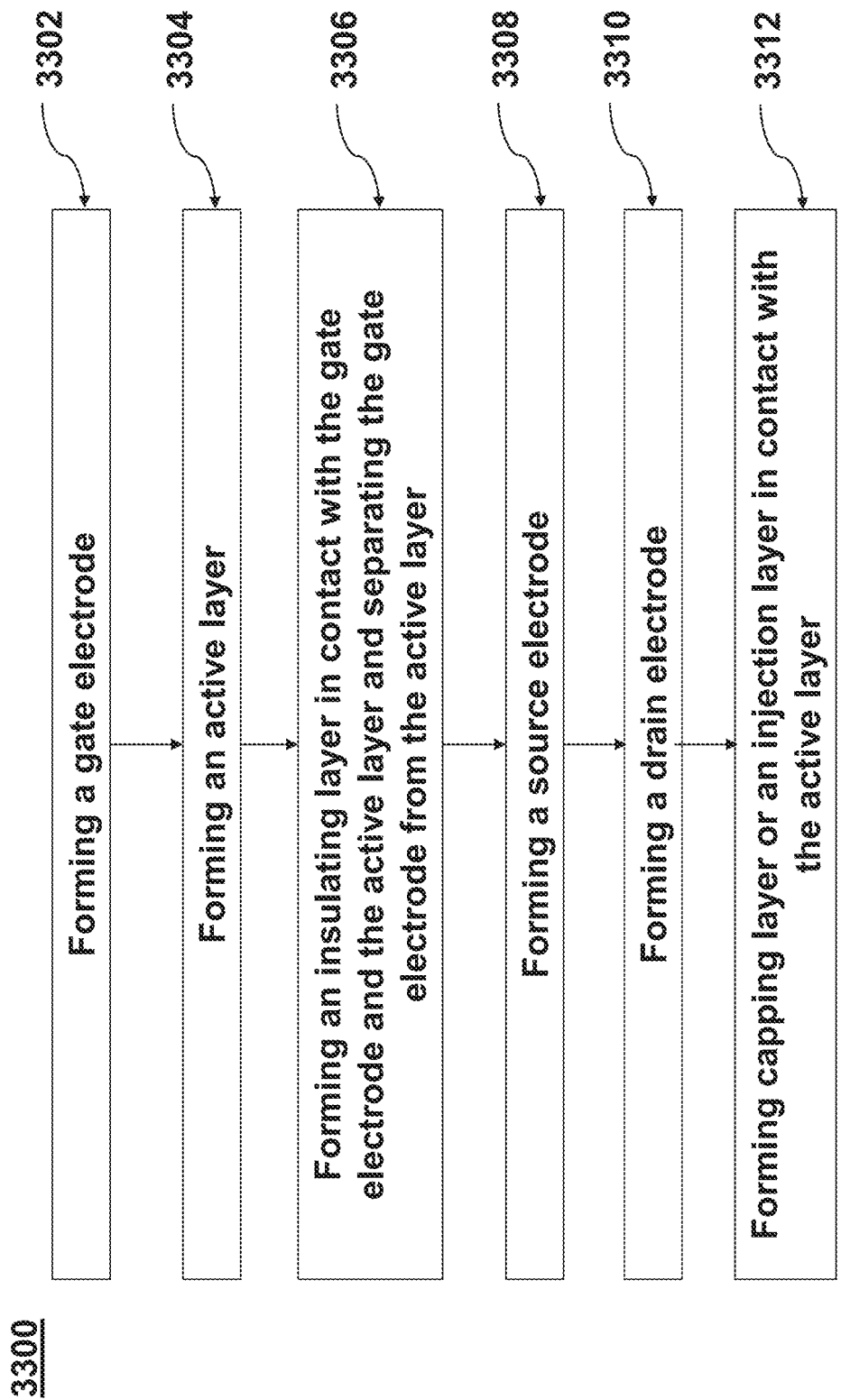
FIG. 33 is a flowchart illustrating stages of a method of manufacturing a transistor structure, according to various embodiments.

FIG. 32 is a flowchart illustrating stages of a method 3200 of manufacturing an embodiment transistor structure (e.g., front gate TFT structure), according to various embodiments. In operation 3202, the method 3200 may include forming a buffer layer 116 over a substrate, as described above with reference to FIGS. 16, 21, and 25. In operation 3204, the method 3200 may include (1) optionally forming a carrier modification device in the form of a capping layer 118 over the buffer layer 116 (e.g., see FIG. 16). In operation 3206, the method 3200 may include forming an active layer 106 over the buffer layer 116 (e.g., see FIGS. 17, 21, and 25) and over the optional capping layer 118 (e.g., see FIG. 17), if present. In operation 3208, the method 3200 may include (2) optionally forming a carrier modification device in the form of a capping layer 118 over the active layer 106 (e.g., see FIG. 21). In operation 3210, the method 3200 may include forming an insulating layer 104 over the active layer 106 (e.g., see FIGS. 18, 22, and 26) and over the optional capping layer 118 (e.g., see FIG. 22), if present.

In operation 3212, the method 3200 may include forming a gate electrode 102 over the insulating layer 104 (e.g., see FIGS. 18, 22, and 26). In operation 3214, the method 3200 may include forming an inter-layer dielectric layer 108 over portions of the active layer 106 adjacent to the gate electrode 102 and insulating layer 104 (e.g., see FIGS. 19, 23, and 27). In operation 3216, the method 3200 may include etching the inter-layer dielectric layer 108 to form a first via cavity 109*a* and a second via cavity 109*b* (e.g., see FIGS. 19, 23, and 27). In operation 3218, the method 3200 may include (3) optionally forming the carrier modification device in the form of a first injection layer 110*a* and a second injection layer 110*b* in the first via cavity 109*a* and the second via cavity 109*b*, respectively (e.g., see FIG. 28). In operation 3220, the method 3200 may include respectively forming a source electrode 112 and a drain electrode 114 within the first via cavity 109*a* and second via cavity 109*b* (e.g., see FIGS. 20, 24, and 29) and over the optional first injection layer 110*a* and the second injection layer 110*b* (e.g., see FIG. 29), if present.

In the above described method 3200, option (1) corresponds to the embodiment structure 2000 of FIG. 20, option (2) corresponds to the embodiment structure 2400 of FIG. 24, and option (3) corresponds to the embodiment structure 2900 of FIG. 29. Further embodiments may include two or more of options (1), (2), and (3). For example, certain embodiments (not shown) may include a first injection layer 110*a*, a second injection layer 110*b*, and a capping layer 118.

When operations (1) or (2) of method 3200 are performed, forming the capping layer 118 may further include conformally depositing a layer of one or more of $InO_x$, $GaO_x$, ZnO, IZO, $CaO_x$/ZnO, ZnO/$GaO_x$, Al, Mo, W, Ti, Ca, oxides thereof, and alloys thereof, and patterning the deposited layer to form the capping layer 118, as described above with reference to FIGS. 16 and 21. Forming the capping layer 118 over the active layer 106 may further include conformally depositing and patterning an oxide material having a thickness in a range from 0.1 nm to 1 nm, from 0.5 nm to 2 nm, from 1 nm to 3 nm, or from 2 nm to 10 nm; or conformally depositing and patterning a metal having a thickness in a range from 1 nm to 20 nm, from 10 nm to 50 nm, or from 30 nm to 100 nm, 50 nm to 150 nm, 100 nm to 200 nm, 150 nm to 300 nm, or 200 nm to 500 nm.

When optional operation (3) of method 3200 is performed, forming a first injection layer 110*a* and a second injection layer 110*b* in the first via cavity 109*a* and the second via cavity 109*b*, respectively may further include conformally depositing, in each of the first via cavity 109*a* and the second via cavity 109*b*, a layer of one or more of $InO_x$, InGaZnO, InZnO, $CaO_x$, ZnO, $CaO_x$/ZnO, ZnO/$GaO_x$, TiN, TaN, Au, Pt, Ru, and alloys thereof to thereby form the first injection layer 110*a* and the second injection layer 110*b*, as described above with reference to FIG. 28. Forming a first injection layer 110*a* and a second injection layer 110*b* in the first via cavity 109*a* and the second via cavity 109*b*, respectively may further include conformally depositing, in each of the first via cavity and the second via cavity, an oxide material having a thickness in a range from 0.1 nm to 1 nm, from 0.5 nm to 2 nm, from 1 nm to 3 nm, or from 2 nm to 10 nm; or conformally depositing, in each of the first via cavity and the second via cavity, a metal or a nitride material having a thickness in a range from 1 nm to 20 nm, from 3 nm to 12 nm, or from 5 nm to 10 nm.

Various embodiments may include a transistor (e.g., see FIGS. 5, 10, 15, 20, 24, and 29) structure that may include a gate electrode 102 and an active layer 106 that may include one or more of amorphous silicon, InGaZnO, InGaO, InWO, InZnO, InSnO, ZnO, GaO, InO, and alloys thereof, as described above with reference to FIGS. 3, 7, 12, 17, and 21. The transistor structure may further include an insulating layer 104 in contact with the gate electrode 102 and the active layer 106 and separating the gate electrode 102 from the active layer 106. The transistor structure may further include a source electrode 112, a drain electrode 114, and a carrier modification device in contact with the active layer, wherein the carrier modification device is configured to reduce carrier concentration variations in the active layer.

In an embodiment, the carrier modification device may include a first injection layer 110*a* in contact with the source electrode 112 and the active layer 106 and separating the source electrode 112 from the active layer 106. The carrier modification device may further include a second injection layer 110*b* (e.g., see FIGS. 15 and 29) in contact with the drain electrode 114 and the active layer 106 and separating the drain electrode 114 from the active layer 106. Further, the first injection layer 110*a* and the second injection layer 110*b* may act to reduce a carrier concentration within the active layer 106 respectively near the source electrode 112 and near the drain electrode 114 relative to corresponding carrier concentrations that would exist in the active layer 106 in the absence of the first injection layer 110*a* and the second injection layer 110*b* such that the source electrode 112 and the drain electrode 114 were in direct contact with the active layer 106. The first injection layer 110*a* and the second injection layer 110*b* may each include one or more of $InO_x$, InGaZnO, InZnO, $CaO_x$, ZnO, $CaO_x$/ZnO, ZnO/$GaO_x$, TiN, TaN, Au, Pt, Ru, and alloys thereof (e.g., see FIGS. 14 and 28 and related description) and may have a thickness in a range from approximately 0.1 nm to 20 nm.

In another embodiment, the first injection layer 110*a* and the second injection layer 110*b* may each include an oxide material having a thickness in a range from 0.1 nm to 10 nm. In another embodiment, the first injection layer 110*a* and the second injection layer 110*b* may each include a metal or a nitride material and have a thickness in a range from 1 nm to 20 nm (e.g., see FIGS. 14 and 28 and related description). In another embodiment, the first injection layer 110*a* and the second injection layer 110*b* may each include a material having a first value of electronegativity and the source electrode 112 and the drain electrode 114 may each have a second value of electronegativity. The materials used for the first injection layer 110*a*, the second injection layer 110*b*, the source electrode 112, and the drain electrode 114 may be chosen such that the first value of electronegativity is greater than the second value of electronegativity.

In one embodiment, the active layer may have a top surface 120*a* and a bottom surface 120*b* (e.g., see FIGS. 5, 10, 15, 20, 24, and 29) and the source electrode 112 and the drain electrode 114 may be each disposed on the top surface 120a of the active layer 106 and the gate electrode 102 may be disposed closer to the bottom surface 120b of the active layer 106 than to the top surface 120a of the active layer 106 such that the thin film transistor structure is configured as a back gate structure (e.g., see FIGS. 5, 10, and 15). In further embodiments, source electrode 112 and the drain electrode 114 are each disposed on the top surface 120a of the active layer 106, and the gate electrode 102 is disposed closer to the top surface 120a of the active layer 106 than to the bottom surface 120b of the active layer 106 such that the transistor structure 2000 is configured as a front gate structure (e.g., see FIGS. 20, 24, and 29).

In a further embodiment, the carrier modification device may include a capping layer 118 in contact with the active layer 106. The capping layer 118 may include one or more of $InO_x$, $GaO_x$, ZnO, IZO, $CaO_x$/ZnO, ZnO/$GaO_x$, Al, Mo, W, Ti, Ca, oxides thereof, and alloys thereof, as described above with reference to FIGS. 2, 8, 16, and 21), and may have a thickness in a range from 0.1 nm to 500 nm. The capping layer 118 may include an oxide material having a thickness in a range from 0.1 nm to 10 nm. In one embodiment, the capping layer 118 may include a metal having a thickness in a range from 1 nm to 500 nm. In one embodiment, the capping layer 118 may have a first value of electronegativity and the insulating layer 104 has a second value of electronegativity and the first value of electronegativity may be less than the second value of electronegativity such that the capping layer 118 acts as a carrier doner layer, as described above.

The capping layer 118 may be disposed on the top surface 120a of the active layer 106 (e.g., see FIGS. 10 and 24) and may be positioned symmetrically relative to the source electrode 112 and the drain electrode 114. In other embodiments, the capping layer 118 may be disposed on the bottom surface 120b of the active layer 106 (e.g., see FIGS. 5 and 20) and may be positioned symmetrically relative to the source electrode and the drain electrode.

Further embodiments may include a semiconductor structure 3000 as illustrated, for example, in FIG. 30. In this regard, the semiconductor structure may include a substrate 9 including a plurality of CMOS transistors 710. The semiconductor structure 3000 may further include an interconnect structure having a plurality of metal interconnect level structures (612, 618, 622, 628, 632, 638) and a thin-film transistor structure (500, 810, 1000, 1500, 2000, 2400) formed in one of the metal interconnect level structures.

The thin-film transistor (e.g., see FIGS. 5, 10, 15, 20, 24, and 29) may include a gate electrode 102; an active layer 106 including one or more of amorphous silicon, InGaZnO, InGaO, InWO, InZnO, InSnO, ZnO, GaO, InO, and alloys thereof; and an insulating layer 104 in contact with the gate electrode 102 and the active layer 106 and separating the gate electrode 102 from the active layer 106. The thin-film transistor may further include a source electrode 112, a drain electrode 114, a first injection layer 110a in contact with the source electrode 112 and the active layer 106 and separating the source electrode 112 from the active layer 106, and a second injection layer 110b in contact with the drain electrode 114 and the active layer 106 and separating the drain electrode 114 from the active layer 106.

The thin-film transistor may further include a carrier modification device (110a, 110b, 118) in contact the active layer 106, wherein the carrier modification device is configured to reduce carrier concentration variations in the active layer 106. The carrier modification device may include a capping layer 118 and/or first injection layer 110a and the second injection layer 110b. The presence of the capping layer 118 and/or injection layers (110a, 110b) may act to reduce short channel effects by reducing carrier concentration variations in the active layer. In this way, the capping layer 118 and/or injection layers (110a, 110b) may act as a carrier modification device.

Thus, in an embodiment, the carrier modification device may include: a first injection layer 110a in contact with the source electrode 112 and the active layer 106 and separating the source electrode 112 from the active layer 106; a second injection layer 110b in contact with the drain electrode 114 and the active layer 106 and separating the drain electrode 114 from the active layer 106, wherein the first injection layer 110a and the second injection layer 110b each may include one or more of $InO_x$, InGaZnO, InZnO, $CaO_x$, ZnO, $CaO_x$/ZnO, ZnO/$GaO_x$, TiN, TaN, Au, Pt, Ru, and alloys thereof, and wherein the first injection layer 110a and the second injection layer 110b may have a thickness in a range from approximately 0.1 nm to 20 nm.

In one embodiment, the active layer may have a top surface 120a and a bottom surface 120b (e.g., see FIGS. 5, 10, 15, 20, 24, and 29) and the source electrode 112 and the drain electrode 114 may be each disposed on the top surface 120a of the active layer 106 and the gate electrode 102 may be disposed closer to the bottom surface 120b of the active layer 106 than to the top surface 120a of the active layer 106 such that the thin film transistor structure is configured as a back gate structure (e.g., see FIGS. 5, 10, and 15). In further embodiments, source electrode 112 and the drain electrode 112 are each disposed on the top surface 120a of the active layer 106, and the gate electrode 102 is disposed closer to the top surface 120a of the active layer 106 than to the bottom surface 120b of the active layer 106 such that the transistor structure 2000 is configured as a front gate structure (e.g., see FIGS. 20, 24, and 29).

In an embodiment, the carrier modification device may include: a capping layer 118 in contact with the active layer 106, wherein the capping layer 118 may include one or more of $InO_x$, $GaO_x$, ZnO, IZO, $CaO_x$/ZnO, ZnO/$GaO_x$, Al, Mo, W, Ti, Ca, oxides thereof, and alloys thereof, and wherein the capping layer 118 may have a thickness in a range from 0.1 nm to 500 nm.

In an embodiment, the active layer may include a top surface 120a and a bottom surface 120b, and wherein the capping layer 118 may be disposed on the top surface 120a of the active layer 106 and may be positioned symmetrically relative to the source electrode 112 and the drain electrode 114. In other embodiments, the active layer 106 may include a top surface 120a and a bottom surface 120b, and wherein the capping layer 118 may be disposed on the bottom surface 120b of the active layer 106 and may be positioned symmetrically relative to the source electrode 112 and the drain electrode 114.

The above-described embodiments provide advantages over existing semiconductor structures in that short-channel effects may be reduced or eliminated by the presence of capping layers and/or injection layers. In turn, devices may be further reduced in size while maintaining performance metrics of larger devices. Further, the disclosed capping layers and/or injection layers may be incorporated into two-dimensional and three-dimensional circuit elements to further increases in area and volume densities of integrated circuits. The disclosed embodiments may be incorporated into thin film transistor structures for use in back-end-of-the-line structures used in three-dimensional integrated circuits.

The foregoing outlines features of several embodiments so that those skilled in the art may better understand the aspects of this disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of the present disclosure.

What is claimed is:

1. A transistor structure, comprising:
   a gate electrode;
   an active layer comprising one or more of amorphous silicon, InGaZnO, InGaO, InWO, InZnO, InSnO, ZnO, GaO, InO, and alloys thereof;
   an insulating layer in contact with the gate electrode and the active layer and separating the gate electrode from the active layer;
   a source electrode;
   a drain electrode; and
   a carrier modification device in contact with the active layer, wherein the carrier modification device is configured to reduce gradients of carrier concentration in the active layer.

2. The transistor structure of claim 1, wherein the carrier modification device comprises:
   a first injection layer in contact with the source electrode and the active layer and separating the source electrode from the active layer;
   a second injection layer in contact with the drain electrode and the active layer and separating the drain electrode from the active layer, wherein
   the first injection layer and the second injection layer each comprise one or more of $InO_x$, InGaZnO, InZnO, $CaO_x$, ZnO, $CaO_x$/ZnO, ZnO/$GaO_x$, TiN, TaN, Au, Pt, Ru, and alloys thereof, and
   wherein the first injection layer and the second injection layer have a thickness in a range from approximately 0.1 nm to 20 nm.

3. The transistor structure of claim 1, wherein the active layer comprises a top surface and a bottom surface, and
   wherein the source electrode and the drain electrode are each disposed on the top surface of the active layer and the gate electrode is disposed on the bottom surface of the active layer.

4. The transistor structure of claim 1, wherein the active layer comprises a top surface and a bottom surface, and
   wherein the gate electrode, the source electrode, and the drain electrode are each disposed on the top surface of the active layer.

5. The transistor structure of claim 1, wherein the carrier modification device comprises:
   a capping layer in contact with the active layer, wherein the capping layer comprises one or more of $InO_x$, $GaO_x$, ZnO, IZO, $CaO_x$/ZnO, ZnO/$GaO_x$, Al, Mo, W, Ti, Ca, oxides thereof, and alloys thereof, and
   wherein the capping layer has a thickness in a range from 0.1 nm to 500 nm.

6. The transistor structure of claim 5, wherein the active layer comprises a top surface and a bottom surface, and
   wherein the capping layer is disposed on the top surface of the active layer and is positioned symmetrically relative to the source electrode and the drain electrode.

7. The transistor structure of claim 5, wherein the active layer comprises a top surface and a bottom surface, and
   wherein the capping layer is disposed on the bottom surface of the active layer and is positioned symmetrically relative to the source electrode and the drain electrode.

8. A semiconductor structure, comprising:
   a substrate comprising a plurality of CMOS transistors;
   an interconnect structure having a plurality of metal interconnect level structures; and
   a thin-film transistor structure formed in one of the metal interconnect level structures, the thin-film transistor structure comprising:
      a gate electrode;
      an active layer comprising one or more of amorphous silicon, InGaZnO, InGaO, InWO, InZnO, InSnO, ZnO, GaO, InO, and alloys thereof;
      an insulating layer in contact with the gate electrode and the active layer and separating the gate electrode from the active layer;
      a source electrode;
      a drain electrode; and
      a carrier modification device in contact with the active layer, wherein the carrier modification device is configured to reduce gradients of carrier concentration in the active layer.

9. The semiconductor structure of claim 8, wherein the carrier modification device comprises:
   a first injection layer in contact with the source electrode and the active layer and separating the source electrode from the active layer;
   a second injection layer in contact with the drain electrode and the active layer and separating the drain electrode from the active layer,
   wherein the first injection layer and the second injection layer each comprise one or more of $InO_x$, InGaZnO, InZnO, $CaO_x$, ZnO, $CaO_x$/ZnO, ZnO/$GaO_x$, TiN, TaN, Au, Pt, Ru, and alloys thereof, and
   wherein the first injection layer and the second injection layer have a thickness in a range from approximately 0.1 nm to 20 nm.

10. The semiconductor structure of claim 8, wherein the active layer comprises a top surface and a bottom surface, and
    wherein the source electrode and the drain electrode are each disposed on the top surface of the active layer and the gate electrode is disposed on the bottom surface of the active layer.

11. The semiconductor structure of claim 8, wherein the active layer comprises a top surface and a bottom surface, and
    wherein the gate electrode, the source electrode, and the drain electrode are each disposed on the top surface of the active layer.

12. The semiconductor structure of claim 8, wherein the carrier modification device comprises:
    a capping layer in contact with the active layer, wherein the capping layer comprises one or more of $InO_x$, $GaO_x$, ZnO, IZO, $CaO_x$/ZnO, ZnO/$GaO_x$, Al, Mo, W, Ti, Ca, oxides thereof, and alloys thereof, and
    wherein the capping layer has a thickness in a range from 0.1 nm to 500 nm.

13. The semiconductor structure of claim 12, wherein the active layer comprises a top surface and a bottom surface, and wherein the capping layer is disposed on the top surface of the active layer and is positioned symmetrically relative to the source electrode and the drain electrode.

14. The semiconductor structure of claim 12, wherein the active layer comprises a top surface and a bottom surface, and wherein the capping layer is disposed on the bottom surface of the active layer and is positioned symmetrically relative to the source electrode and the drain electrode.

15. A method of fabricating a transistor structure, the method comprising:
forming a gate electrode;
forming an active layer;
forming an insulating layer in contact with the gate electrode and the active layer and separating the gate electrode from the active layer;
forming a source electrode;
forming a drain electrode; and
forming a carrier modification device in contact with the active layer,
wherein the carrier modification device reduces short channel effects by reducing gradients of carrier concentration in the active layer.

16. The method of claim 15, wherein the carrier modification device comprises a first injection layer and a second injection layer, and forming the carrier modification device comprises:
forming the first injection layer and the second injection layer each in contact with the active layer,
wherein the first injection layer and the second injection layer each comprise a material having a first value of electronegativity and the source electrode and the drain electrode each have a second value of electronegativity, and
wherein the first value of electronegativity is greater than the second value of electronegativity.

17. The method of claim 15, wherein the carrier modification device comprises a first injection layer and a second injection layer, and forming the carrier modification device comprises:
forming the first injection layer and the second injection layer each in contact with the active layer,
wherein the first injection layer and the second injection layer each comprise one or more of $InO_x$, InGaZnO, InZnO, $CaO_x$, ZnO, $CaO_x$/ZnO, ZnO/$GaO_x$, TiN, TaN, Au, Pt, Ru, and alloys thereof, and
wherein the first injection layer and the second injection layer have a thickness in a range from approximately 0.1 nm to 20 nm.

18. The method of claim 15, wherein the carrier modification device comprises a capping layer, and forming the carrier modification device comprises:
forming the capping layer in contact with the active layer,
wherein the capping layer has a first value of electronegativity and the active layer has a second value of electronegativity, and
wherein the first value of electronegativity is less than the second value of electronegativity.

19. The method of claim 15, wherein the carrier modification device comprises a capping layer, and forming the carrier modification device comprises:
forming the capping layer in contact with the active layer,
wherein the capping layer comprises one or more of $InO_x$, $GaO_x$, ZnO, IZO, $CaO_x$/ZnO, ZnO/$GaO_x$, Al, Mo, W, Ti, Ca, oxides thereof, and alloys thereof, and
wherein the capping layer has a thickness in a range from 0.1 nm to 500 nm.

20. The method of claim 15, wherein the carrier modification device comprises a capping layer, and forming the carrier modification device comprises:
forming the capping layer in contact with the active layer, wherein a width of the capping layer is smaller than a distance between the source electrode and the drain electrode.

* * * * *